US011278891B2

(12) United States Patent
Govyadinov et al.

(10) Patent No.: US 11,278,891 B2
(45) Date of Patent: Mar. 22, 2022

(54) FLUIDIC CHANNELS FOR MICROFLUIDIC DEVICES

(71) Applicant: HEWLETT-PACKARD DEVELOPMENT COMPANY, L.P., Houston, TX (US)

(72) Inventors: Alexander Govyadinov, Corvallis, OR (US); Erik D. Torniainen, Boise, ID (US); Pavel Kornilovich, Corvallis, OR (US); David P. Markel, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 506 days.

(21) Appl. No.: 15/763,402

(22) PCT Filed: Sep. 25, 2015

(86) PCT No.: PCT/US2015/052362

§ 371 (c)(1),
(2) Date: Mar. 26, 2018

(87) PCT Pub. No.: WO2017/052625

PCT Pub. Date: Mar. 30, 2017

(65) Prior Publication Data

US 2018/0272340 A1 Sep. 27, 2018

(51) Int. Cl.

*B81B 1/00* (2006.01)
*B01L 3/00* (2006.01)

(52) U.S. Cl.

CPC ..... *B01L 3/50273* (2013.01); *B01L 3/502707* (2013.01); *B01L 2300/0816* (2013.01);

(Continued)

(58) Field of Classification Search

None

See application file for complete search history.

(56) References Cited

U.S. PATENT DOCUMENTS 6,130,098 A 10/2000 Handique
6,521,188 B1 2/2003 Webster (Continued)

FOREIGN PATENT DOCUMENTS

CN 2637765 9/2004
CN 104641240 A 5/2015

(Continued)

OTHER PUBLICATIONS

Tovar, Armando R.; "Lateral Cavity Acoustic Transducer"; Lab on a Chip, vol. 9. No. 1; Jan. 1, 2009; pp. 41-43.

*Primary Examiner* — Paul S Hyun

(74) *Attorney, Agent, or Firm* — Fabian VanCott

(57) ABSTRACT

Example fluidic channels for microfluidic devices are disclosed. In examples disclosed herein, an example microfluidic device includes a body having a microfluidic network. The microfluidic network includes a main fluid channel to transport a biological fluid from a first cavity of the microfluidic network to a second cavity of the microfluidic network. An auxiliary fluid channel is in fluid communication with to the main fluid channel. The auxiliary fluid channel has a first end and a second end. The first end is in fluid communication with the main fluid channel and the second end is spaced from the main fluid channel. A fluid actuator is positioned in the auxiliary fluid channel to induce fluid flow in the main fluid channel.

17 Claims, 11 Drawing Sheets

(52) U.S. Cl.
CPC . *B01L 2300/0861* (2013.01); *B01L 2400/043* (2013.01); *B01L 2400/0436* (2013.01); *B01L 2400/0439* (2013.01); *B01L 2400/0442* (2013.01); *B01L 2400/0481* (2013.01); *B01L 2400/06* (2013.01)

(56) References Cited

U.S. PATENT DOCUMENTS

| | | | | |
|---|---|---|---|---|
| 6,749,407 | B2 | 6/2004 | Xie et al. | |
| 6,911,183 | B1 | 6/2005 | Handique et al. | |
| 7,753,656 | B2 | 7/2010 | Lemoff et al. | |
| 8,814,293 | B2 | 8/2014 | Strunk et al. | |
| 8,840,981 | B2 | 9/2014 | Sieber | |
| 8,980,199 | B2 | 3/2015 | Imran | |
| 2005/0032240 | A1 | 2/2005 | Lee et al. | |
| 2005/0084203 | A1 | 4/2005 | Kane | |
| 2005/0217743 | A1 | 10/2005 | Bohm | |
| 2012/0152361 | A1* | 6/2012 | Williams | B01L 3/50273 137/1 |
| 2012/0244604 | A1 | 9/2012 | Kornilovich et al. | |
| 2013/0000758 | A1 | 1/2013 | Hoen et al. | |
| 2013/0295655 | A1 | 11/2013 | Imran | |
| 2014/0377145 | A1 | 12/2014 | Govyadinov et al. | |

FOREIGN PATENT DOCUMENTS

| | | | |
|---|---|---|---|
| TW | 201343256 | A | 11/2013 |
| TW | 201525461 | A | 7/2015 |
| WO | WO-2015116068 | A1 | 8/2015 |

* cited by examiner

FLUIDIC CHANNELS FOR MICROFLUIDIC DEVICES

BACKGROUND

Microfluidic systems such as, for example, fluid ejection systems (e.g., an ink jet cartridge), microfluidic biochips, etc., often employ microfluidic apparatus (or devices). Microfluidic apparatus may enable manipulation and/or control of small volumes of fluid through microfluidic fluid channels or networks of the microfluidic systems. For example, microfluidic devices may enable manipulation and/or control of volumes of fluid on the order of microliters (i.e., symbolized µl and representing units of $10^{-6}$), nanoliters (i.e., symbolized nl and representing units of $10^{-9}$ liter), or picoliters (i.e., symbolized pl and representing units of $10^{-12}$ liter).

BRIEF DESCRIPTION OF THE DRAWINGS

Where ever possible the same reference numbers will be used throughout the drawing(s) and accompanying written description to refer to the same or like parts.

DETAILED DESCRIPTION

Figure 1:
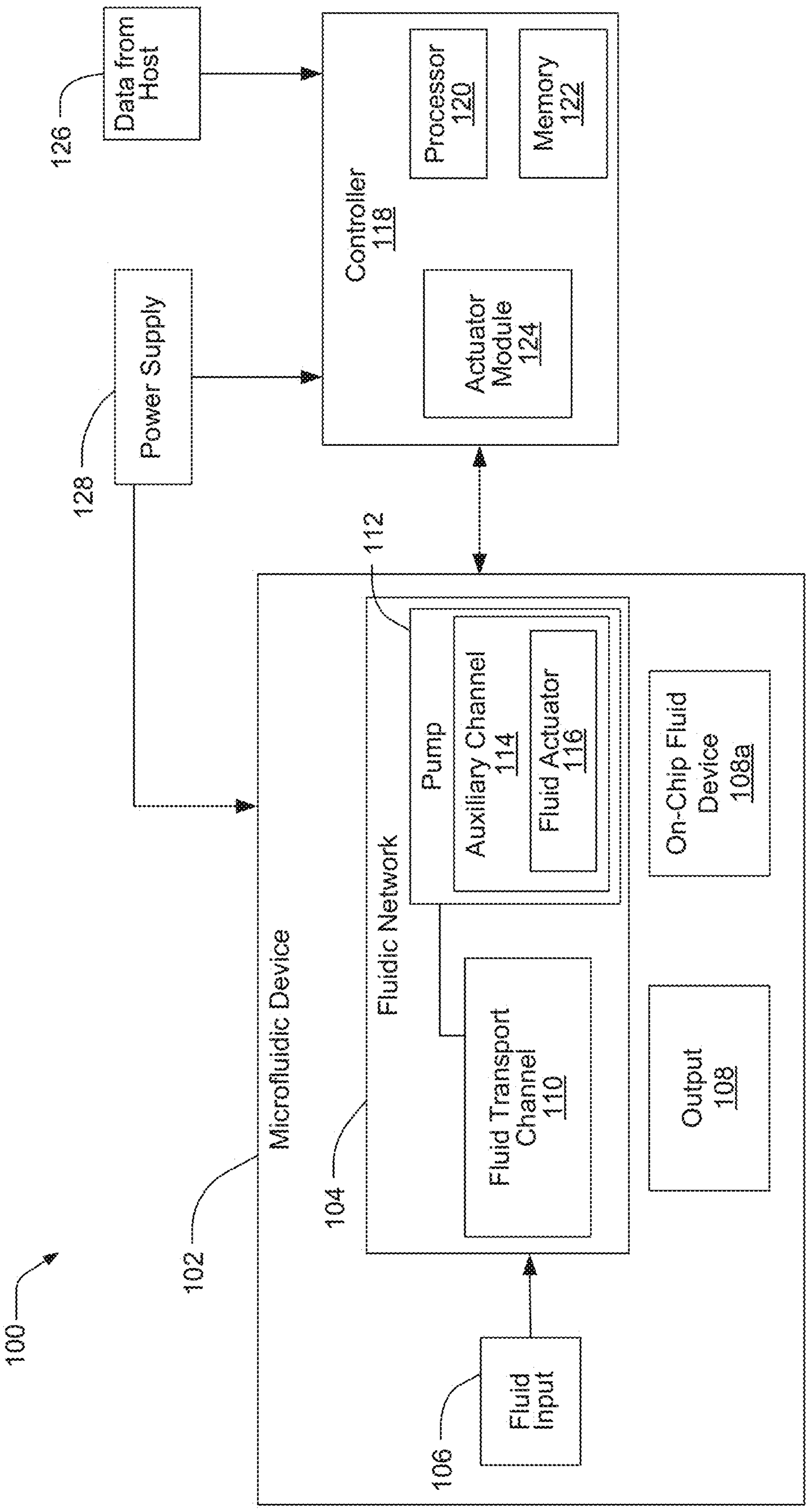
FIG. 1 is an example microfluidic system having an example microfluidic device constructed in accordance with the teachings described herein.

Certain examples are shown in the above-identified figures and described in detail below. The figures are not necessarily to scale and certain features and certain views of the figures may be shown exaggerated in scale or in schematic for clarity and/or conciseness. Additionally, some components of example microfluidic apparatus disclosed herein have been removed from some of the drawing(s) for clarity. Although the following discloses example methods and apparatus, it should be noted that such methods and apparatus are merely illustrative and should not be considered as limiting the scope of this disclosure.

As used herein, directional terms, such as "upper," "lower," "top," "bottom," "front," "back," "leading," "trailing," "left," "right," etc. are used with reference to the orientation of the figures being described. Because components of various examples disclosed herein can be positioned in a number of different orientations, the directional terminology is used for illustrative purposes only and is not intended to be limiting.

Microfluidic devices employ a network of fluidic flow paths. Microfluidic devices are often employed by microfluidic systems to enable manipulation of fluids (e.g., liquids) through a fluid network having fluidic channels with cross-sectional dimensions ranging from a few nanometers to hundreds of micrometers. In some examples, a microfluidic biochip, often referred to as "lab-on-chip" systems, employs microfluidic devices to transport and/or manipulate fluid (e.g., a biological sample) through, for example, an analyzer to determine information about the biological sample. In some examples, fluid ejection systems (e.g., an inkjet printhead of an inkjet printer) employ microfluidic devices to channel fluid from, for example, a reservoir to an ejection nozzle of the fluid ejection system.

Microfluidic devices employ a network of main flow channels to fluidly couple a first portion (e.g., a first reservoir) of a fluidic network and a second portion (e.g., a second reservoir) of a fluidic network. To manage or promote fluid flow in microfluidic devices, some known microfluidic systems include passive and/or active pumping apparatus such as, for example, external equipment and pump mechanisms, capillary type pumps, electrophoretic pumps, peristaltic and rotary pumps and/or fluid actuators (e.g., bubble generators, piezoelectric elements, thermal resistors, etc.). In some examples, when employed with microfluidic systems, external equipment and pump mechanisms are not micrometer in scale and may often be relatively larger in scale compared to the microfluidic devices. For example, external equipment and pump mechanisms include, for example, external syringes or pneumatic pumps. However, managing fluid flow through a microfluidic device using external equipment such as external syringes and/or pneumatic pumps may limit the range of applications for microfluidic systems. Further, these types of pumps may also be limited in versatility by the number of external fluidic connections the microfluidic device can accommodate. A capillary pump provides a passive system, resulting in the microfluidic device providing a predetermined or preset fluid flow rate that cannot be altered or changed. Electrophoretic pumps may involve specialized coating, complex three-dimensional geometries and high operating voltages. Peristaltic and/or rotary pumps include moving parts that are difficult to miniaturize to nanoscale.

To control fluid flow through the main flow channels, microfluidic devices often employ fluid actuators. Some microfluidic devices employ fluid actuators such as, bubble generators or resistors (e.g., a thermal resistor) to manage fluid flow through fluidic channels of the microfluidic device. To induce fluid flow through main flow channels, fluid actuators may be positioned inside a flow channel of a microfluidic device fluidly coupling a first portion of a fluidic network and a second portion of a fluidic network and asymmetrically relative to an overall length of the microfluidic device. Such fluid actuators may be beneficial because they can be positioned and/or formed on a nanometer scale to fit within a flow channel of the fluidic network. Thus, fluid in the passageway flows across the fluid actuator that is positioned in the fluid flow passageway. When activated, the fluid actuator creates a localized high pressure zone within the fluid channel adjacent the fluid actuator to produce a net fluid flow through the fluid network. In some instances, a fluid actuator such as, for example, a resistor also generates localized heat adjacent the fluid actuator and/or the high pressure region during actuation. However, in some instances, fluid (e.g., biological fluid having cells) flowing in the fluid flow passageway and across the fluid actuator may become damaged (e.g., lysing) due to the localized high pressure zone and/or the heat generated in the fluid passageway by the fluid actuator positioned inside the fluid flow passageway. In some example, fluid(s) disclosed herein may include, but is not limited to, fragile components of fluid such as, for example, bio-chemical ingredients, biological fluid, biological cells, and/or other fluid that may be damaged due to expose to relative high pressure zone and/or thermal impact generated by a fluid actuator (e.g., an inertial pump, resistor, a piezo element, etc.) of a microfluidic device.

The example microfluidic devices disclosed herein protect fluids (e.g., biological fluids containing cells) from high pressure and/or thermal impact flowing through a main fluid flow passageway or transport channel. In some examples, the example microfluidic devices disclosed herein employ pumps that isolate, reduce, or even eliminate exposure of the fluid flowing through the main fluid flow passageway or transport channel from high pressure and/or thermal impact due to an operation of the pump. To protect fluid flowing through a fluid flow passageway of a main transport channel from high pressure and/or thermal impact (e.g., reduce or even eliminate exposure of fragile components of biochemical or biological fluids to the high pressure zone), the example microfluidic devices disclosed herein employ fluidic networks that include pumps positioned in a separate auxiliary fluid channel (e.g., a cavity) relative to a main fluid flow passageway and/or a transport channel of a fluidic channel. Unlike prior devices, the fluid actuators are not positioned within the main fluid flow passageway or transport channel. In other words, the example pumps disclosed herein employ fluid actuators positioned within auxiliary fluid channels or pump channels (e.g., pump cavities) that are positioned outside of the fluid flow passageway and/or the main transport fluid path of a fluidic channel.

As a result, fluid flow may be generated or induced within a main transport channel of a fluidic network without positioning a pump or fluid actuator within the main transport channel. In other words, a pump or fluid actuator is not positioned within walls or a perimeter of a main fluid flow passageway or a transport channel that carries fluid between a first portion of the fluidic network and a second portion of a fluidic network. For example, the fluid actuators are positioned within auxiliary fluidic channels that are offset but in fluid communication with to the main transport channel. In this manner, a fluid actuator may generate a high pressure zone and/or thermal zone in the auxiliary fluid channel and not within the fluid flow passageway of the transport channel, thereby protecting the fluid in the main flow transport path from the high pressure zone and/or thermal zone created by the fluid actuator and/or the pump. As a result, the example microfluidic devices disclosed herein may be employed with applications involving pressure and/or thermally sensitive bio-chemical ingredients and/or biological fluids.

In some instances, positioning the fluid actuator or more generally the pump outside of the fluid flow passageway of the transport channel may decrease an overall efficiency of the pump. Although positioning the pump or the fluid actuator outside of the transport channel may decrease an efficiency of the pump, the reduced efficiency may be increased by increasing a size of a pump and/or a fluid actuator (e.g., a power size of a resistor) and/or a frequency of actuation of a pump and/or a fluid actuator. In some examples, to increase pumping efficiency, the auxiliary cavity and more generally the pump may be positioned at an angle (e.g., between 10 degrees and 88 degrees) relative to the main transport path. For example, the pump (e.g., a longitudinal axis of the pump) may be positioned at a 45 degree angle relative to (e.g., a longitudinal axis) of the main transport channel. In some examples, the auxiliary cavity is positioned at least substantially perpendicular relative to the main flow path (e.g., an orientation at 90 degrees, and orientation between 88 degrees and 92 degrees). As used herein, substantially and approximately mean 1% to 10% different than the term at issue. For example, substantially perpendicular means 90 degrees plus or minus 1% to 10%. For example, approximately 10 degrees means 10 degrees plus or minus 1% to 10% (e.g., between 9.9 degrees and 10.1 degrees or between 9 degrees and 11 degrees).

Turning more specifically to the illustrated examples, FIG. 1 depicts a microfluidic system 100 that includes a microfluidic device 102 having a fluidic network 104 that is constructed in accordance with the teachings of this disclosure. The microfluidic device 102 and/or the microfluidic system 100 of the illustrated example may implement microfluidic systems including assay systems, microelectronic cooling systems, nucleic acid amplification systems such as polymerase chain reaction (PCR) systems, and/or any systems that involve the use, manipulation, and/or control of small volumes of fluid. For example, the microfluidic device 102 and, more generally the microfluidic system 100 may incorporate components and/or functionality of a room-sized laboratory or system to a small chip such as a microfluidic biochip or "lab-on-chip" that manipulates and/or processes solution based samples and systems by carrying out procedures that may include, for example, mixing, heating, and/or separation. For example, microfluidic biochips can be used to integrate assay operations for analyzing enzymes and DNA, detecting biochemical toxins and pathogens, diagnosing diseases, etc.

To supply fluid or fluidic components, solutions or samples (e.g., biological samples, etc.) to the microfluidic device 102 of the microfluidic system 100, the microfluidic system 100 employs a fluid input 106. The fluid input 106 may be a reservoir or cavity to store or hold, for example, a biological fluid sample, and/or any other fluid to be manipulated, moved, mixed, separated and/or otherwise processed by the microfluidic device 102. The fluid input 106 of the illustrated example is formed with the microfluidic device 102. In some examples, the fluid input 106 may be a reservoir positioned externally relative to the microfluidic device 102. In some examples, the fluid in the fluid input 106 may be pumped to the microfluidic device 102 via an external pump.

To collect the fluid after the fluid has been manipulated by the microfluidic device 102, the microfluidic device 102 of the illustrated example includes an output (e.g., a collector or reservoir). The output 108 of the illustrated example may be reservoir or a cavity that receives the processed fluid. In some examples, prior to the providing the fluid from the fluid input 106 to the output 108, the fluid may be manipulated or processed via an on-chip fluid device 108*a*. The on-chip fluid device 108*a* may be an analyzer, a reactor, a mixer, a thermal detector, a separation chamber, a flow sensor, a nanostructured sensor or biosensors, a metal-oxide-semiconductor field effect transistor (MOSFET), a sensor or biosensor for detecting and/or measuring a concentration of a target molecule, and/or any other on-chip device for analyzing, manipulating and/or preparing the fluid for analysis. In some examples, the fluid processed by the microfluidic device 102 and captured by the output 108 may be analyzed with, for example, an off-chip optical observation apparatus, an off-chip assay and/or other analysis equipment. In some such examples, the on-chip fluid device 108*a* may prepare the fluid for off-chip analysis prior to the output 108 receiving the fluid. In some examples, the microfluidic device 102 does not include the on-chip fluid device 108*a*.

To direct the fluid from the fluid input 106 to the output 108, the fluidic network 104 of the illustrated example includes a fluid transport channel 110 and a pump 112 (e.g., an inertial micro-pump). The pump 112 is in fluid communication with the fluid transport channel 110. The fluid transport channel 110 may employ a plurality of fluidic channels and/or the pump 112 may employ a plurality of pumps to transport and/or carry the between the fluid input 106 and the output 108. To move the fluid from the fluid input 106 to the output 108, the pump 112 of the illustrated example creates fluid flow through the fluid transport channel 110. The pump 112 of the illustrated example includes an auxiliary fluid channel 114 and a fluid actuator 116. In particular, the fluid actuator 116 of the illustrated example is positioned inside the auxiliary fluid channel 114. The fluid actuator 116 may be a piezoelectric element, an acoustic actuator, a thermal bubble resistor actuator, a piezo membrane actuator, an electrostatic (MEMS) membrane actuator, a mechanical/impact driven membrane actuator, a voice coil actuator, a magneto-strictive drive actuator, a mechanical drive, and/or any other fluid and/or mechanical displacement actuator.

When the fluid actuator 116 is activated within the auxiliary fluid channel 114, the pump 112 generates a relatively high pressure (e.g., an inertial bubble-driven pressure). For example, the relatively high pressure may occur (e.g., temporally or for a small duration) during a pump cycle or operation of the fluid actuator 116) to induce fluid flow through the fluid transport channel 110. For example, a large amount of fluid mass transport may occur after this relatively high pressure cycle via inertia under relatively small pressure differences that occur as a result of the relatively high pressure. As described in greater detail below in connection with FIGS. 2-16, the example pump 112 of the illustrated example is positioned relative to the fluid transport channel 110 to prevent or restrict a high pressure zone and/or heat from moving or spilling into the fluid transport channel 110 during actuation of the fluid actuator 116. In this manner, the fluid from the fluid input 106 is protected against pressure and/or thermal impact as the fluid flows through the fluid transport channel 110 to the output 108. Such reduction or even elimination of pressure and/or thermal impact is particularly advantageous to prevent damage to fluids containing, for example, fragile components such as, for example, bio-chemical ingredients, biological cells, etc.

The structures and components of the fluidic network 104 and, more generally the microfluidic device 102, may be fabricated using integrated circuit microfabrication techniques such as electroforming, laser ablation, anisotropic etching, sputtering, dry and wet etching, photolithography, casting, molding, stamping, machining, spin coating, laminating, 3-D printing, and/or any combination thereof and/or any other micro-electrical mechanical system (i.e., MEMS), chip or substrate manufacturing technique(s). In this manner, the fluidic network 104 may include a plurality of fluid transport channels 110 and/or a plurality of pumps 112 on a single chip or substrate. For example, the microfluidic device 102 may include hundreds and/or thousands of fluid transport channels and/or pumps. In some examples, the fluid network 104 may include a plurality of pumps 112 in fluid communication with the fluid transport channel 110. Additionally, the fluidic network 104 may include a transport channel (e.g., the fluid transport channel 110) that includes a one-dimensional, a two-dimensional and/or a three-dimensional topology.

To control fluid flow through the fluidic network 104 and, more generally to control various components and functions of the microfluidic device 102, the example microfluidic system 100 of the illustrated example employs a controller 118. The controller 118 of the illustrated example includes a processor 120, memory 122 and an actuator module 124. For example, the actuator module 124 of the illustrated example may enable selective and/or controlled activation of the fluid actuator 116. For example, the actuator module 124 may determine a sequence, timing, and/or frequency of activating the fluid actuator 116 to precisely control fluid flow and/or volume displacements through the fluid transport channel 110 and, more generally through the fluidic network 104. To determine the sequence, timing and/or frequency of activating the fluid actuator 116, the actuator module 124, the processor 120 and, more generally, the controller 118 of the illustrated example may receive data 126 from a host system, such as a computer. The processor 120, for example, may store the data 126 in the memory 122. The data 126 may be sent to the microfluidic system 100 via communications such as, for example, an electronic, infrared, optical, a wired connection, a wireless connection and/or other communication and/or information transfer path(s). In some examples, the actuator module 124 and/or the processor 120 may receive fluid flow information from, for example, a sensor positioned within the fluidic network 104 to determine the sequence, timing and/or frequency for activating the fluid actuator 116. In some examples, information associated with the analyzed fluid (e.g., from the on-chip fluid device 108*a*, an off-chip analyzer, etc.) may be transmitted to the controller 118 for further analysis or identification.

The microfluidic system 100 of the illustrated example includes a power supply 128 to provide power to the microfluidic device 102, the controller 118, the fluid actuator 116, and/or other electrical components that may be part of the microfluidic device 102 and/or the microfluidic system 100. For example, the power supply 128 provides power to the fluid actuator 116 to activate or induce fluid flow through the fluidic transport channel 110.

Figure 2:
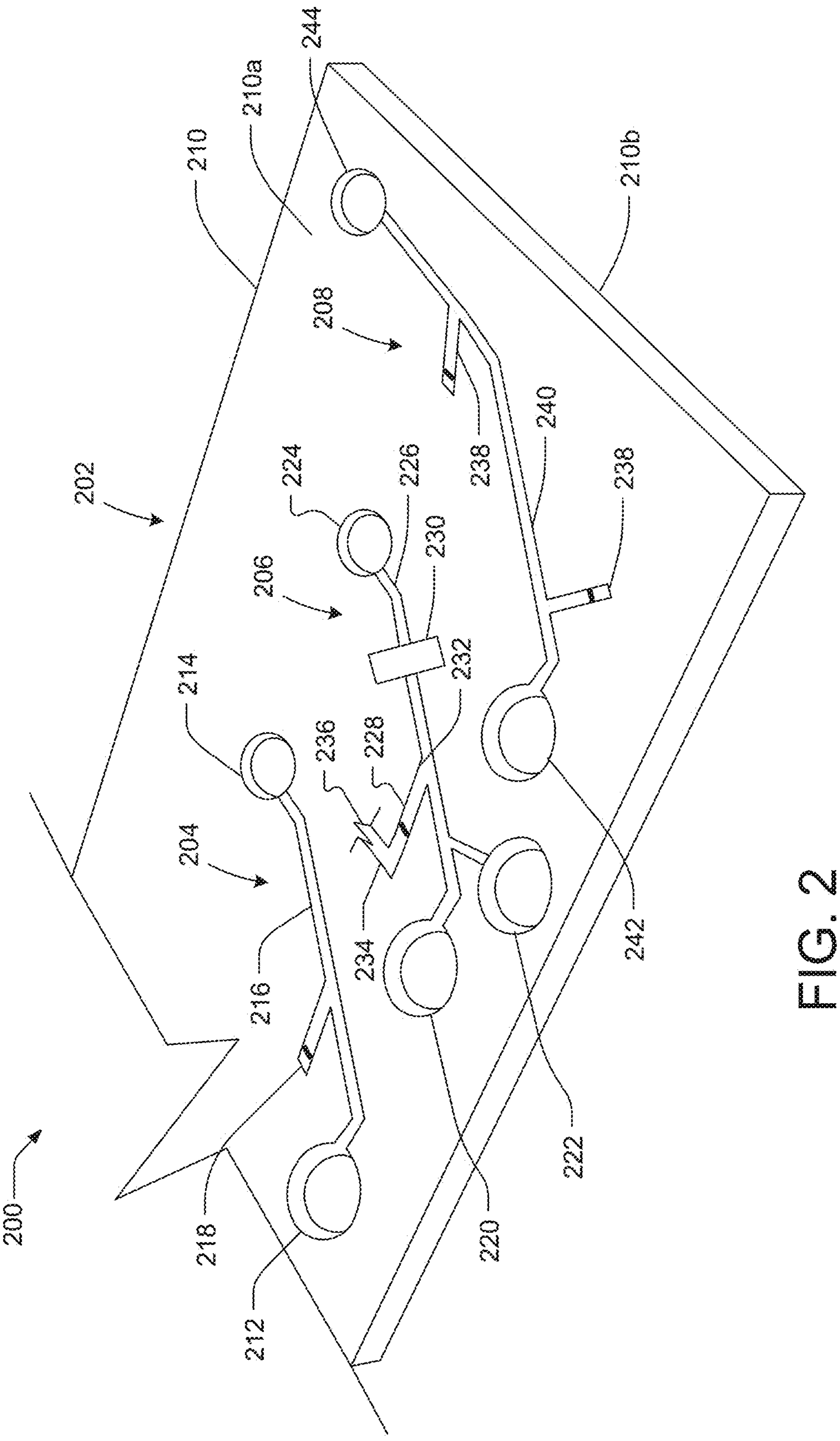
FIG. 2 depicts an example microfluidic device having example microfluidic networks disclosed herein.

FIG. 2 depicts an example microfluidic device 200 that may be used to implement a microfluidic system such as, for example, the microfluidic device 102 of FIG. 1. The microfluidic device 200 of the illustrated example enables manipulation of fluids (e.g., liquids) through a fluidic network 202. For example, the fluidic network 202 may be used to implement the example fluidic network 104 of FIG. 1. Referring to the example of FIG. 2, the fluidic network 202 includes a first fluidic channel 204, a second fluidic channel 206, and a third fluidic channel 208 formed in a body 210

(e.g., a substrate or chip). The fluidic channels 204-208 of the example microfluidic device 200 of FIG. 2 may have cross-sectional dimensions ranging between approximately a few nanometers and approximately hundreds of micrometers. In some examples, the fluidic channels 204-208 may generate fluid flow in only one direction. In other examples, the fluidic channels 204-208 may provide bi-directional fluidic flows. In some examples, the fluidic channels 204-208 may provide two-dimensional and/or three-dimensional topologies (e.g., two-dimensional fluidic channels or three-dimensional fluidic channels). For example, a two-dimensional fluidic network may include a fluidic transport channel that fluidly intersects a second fluidic network channel (e.g., in a non-parallel orientation relative to the first fluidic network channel), where fluid flow is directed in the first fluidic network channel and the second fluidic network channel. A three-dimensional fluidic network may include fluidic channels or fluid transport channels that span between a bottom surface 210*b* of the body 210 and an upper surface 210*a* of the body 210. The body 210 may be a unitary structure or may be formed using multiple layers or structures. In some examples, body 210 may include a multilayer construction that includes a base composed of a resin material and a cover composed of glass. For example, the body 210 may be composed of resin (e.g., SU8 resin), transparent glass, silicon and/or any other material(s).

The first fluidic channel 204 fluidly couples a first portion 212 (e.g., a network channel or reservoir) of the fluidic network 202 and a second portion 214 (e.g., a network channel or reservoir) of the fluidic network 202. In particular, the first fluidic channel 204 of the illustrated example includes a transport channel 216 (e.g., a main fluid flow passageway) and a pump 218 to move fluid (e.g., a biological sample) from the first portion 212 of the fluidic network 202 to the second portion 214 of the fluidic network 202. In the illustrated example, the pump 218 is offset relative to the transport channel 216.

The second fluidic channel 206 of the illustrated example fluidly couples a first reservoir 220 and a second reservoir 222 to a third reservoir 224. In some examples, the first reservoir 220 is a fluid input (e.g., the fluid input 106 of FIG. 1) that may receive a fluid and the second reservoir 222 may contain a reagent material. In some such examples, the third reservoir 224 may be an output (e.g., the output 108 of FIG. 1). The second fluidic channel 206 includes a transport channel 226 and a pump 228 to move fluid from the first reservoir 220 and/or the second reservoir 222 to the third reservoir 224. Also, the second fluidic channel 206 of the illustrated example includes an on-chip fluid device 230 (e.g., the on-chip device 108*a* of FIG. 1) to analyze, manipulate and/or obtain information relating to the fluid prior to the third reservoir 224 receiving the fluid. Further, in the illustrated example, a first end 232 of the pump 228 is in fluid communication with the transport channel 226 and a second end 234 of the pump 228 opposite the first end 232 is spaced from the transport channel 226. In particular, the second end 234 of the pump 228 projects away from the transport channel 226. In the illustrated example, the second end 234 of the pump 228 is in fluid communication with a fourth portion 236 (e.g., a fluidic network) of the second fluidic channel 206. The fourth portion 236 may be, for example, a vent in fluid communication with atmosphere, another fluidic channel of the fluidic network 202, a capped end, etc.

The third network channel 208 of the illustrated example includes a plurality of pumps 238 to move fluid through a transport channel 240 between a first portion 242 of the third fluidic channel 208 and a second portion 244 of the third fluidic channel 208. Each of the pumps 238 includes a first end in fluid communication with the transport channel 240 and a second end projecting away from the transport channel 240. In this example, the fluidic channels 204-206 are shown as being fluidly isolated from each other such that the fluidic channels 204-206 are not fluidly coupled or in fluid communication with each other or other network channels of the fluidic network 202. However, in some examples, the fluidic channel 204-206 may be in fluid communication with each other and/or may be in fluid communication with other network channels of the fluidic network 202.

Figure 3:
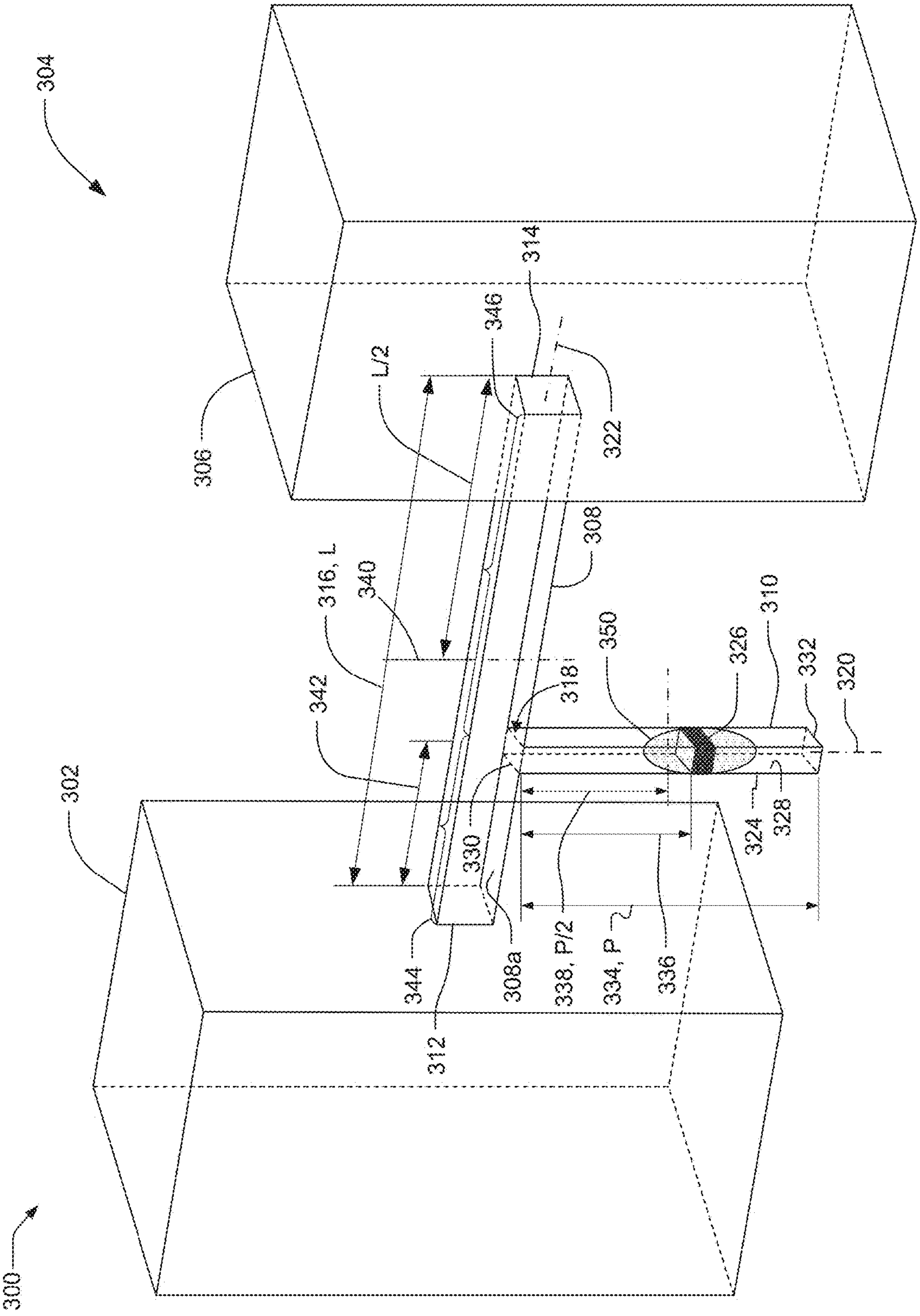
FIG. 3 depicts an example fluidic channel that may be used to implement a microfluidic device constructed in accordance with the teachings of this disclosure.

FIG. 3 depicts an example fluidic channel 300 constructed in accordance of with the teachings of this disclosure. The fluidic channel 300 of the illustrated example may implement a microfluidic device such as, for example, the microfluidic device 102 of FIG. 1 and/or the microfluidic device 200 of FIG. 2. For example, the fluidic channel 300 of the illustrated example may be used to implement the example fluidic network 102 of FIG. 1 and/or the fluidic channels 204-208 of FIG. 2.

To move or transport fluid between a first portion 302 of a fluid network 304 and a second portion 306 of the fluidic network 304, the example fluidic channel 300 includes a transport channel 308 and a pump 310 (e.g., an inertial pump). As described in greater detail below, the pump 310 is in fluid communication with the transport channel 308. In some examples, the first portion 302 and the second portion 306 may be fluid paths or network channels that are in fluid communication with other network channels of the fluidic network 304. In some examples, the first portion 302 and the second portion 306 may be reservoirs (e.g., to store fluid at ambient pressure). For example, the first portion 302 may be the fluid input 108 of FIG. 1 and second portion 306 may be the output 108 of FIG. 1. In some examples, the first portion 302 and/or the second portion 306 may have a volume capacity that is greater than a volume capacity of the transport channel 308 and/or the pump 310. In some examples, the first portion 302 may be in fluid communication with to the second portion 306 via a channel positioned adjacent to, but not in fluid communication with, the transport channel 308 (e.g., spanning an area underneath the transport channel 308).

The transport channel 308 of the illustrated example defines a fluid flow passageway 308*a* (e.g., a main fluid flow passageway or main transport channel) between a first end 312 (e.g., an inlet) of the transport channel 308 and a second end 314 (e.g., an outlet) of the transport channel 308. In the illustrated example, the fluid flow passageway 308*a* is a substantially straight flow path. A substantially straight flow path as used herein may include a fluid flow passageway 308*a* having a horizontal flow path where an axis of the fluid flow passageway 308*a* maybe within 2 degrees (plus or minus 2 degrees) of normal. The first end 312 of the transport channel 308 of the illustrated example is in fluid communication with the first portion 302 of the fluidic network 304 and the second end 314 of the transport channel 308 is in fluid communication with the second portion 306 of the fluidic network 304. For example, the transport channel 308 can transport a biological fluid through the fluid flow passageway 308*a* from the first portion 302 of the fluidic network 304 to the second portion 306 of the fluidic network 304. The transport channel 308 of the illustrated example defines an overall length 316 between the first end 312 and the second end 314. The overall length 316 of the transport channel 308 of the illustrated example may be between approximately 200 micrometers and approximately 400 micrometers. In addition, the transport channel 308 of the illustrated example has a rectangular cross-section defining a width and a height of the transport channel 308. For example, each of the height and the width of the transport channel 308 may be between approximately 10 micrometers and approximately 30 micrometers. However, in other examples, the overall length 316 of the transport channel 308 may be any other length and/or the transport channel 308 may include any another cross-section (e.g., a circular cross-section, a trapezoidal cross-section, a triangular cross-section, etc.).

To prevent or reduce high pressure and/or thermal impact to a fluid flowing though the fluid flow passageway 308*a* between the first and second ends 312 and 314 of the transport channel 308, the pump 310 of the illustrated example is positioned adjacent or is offset relative to the fluid flow passageway 308*a* of the transport channel 308 and positioned between the first and second ends 312 and 314 of the transport channel 308. More specifically, the pump 310 of the illustrated example is positioned outside of the fluid flow passageway 308*a* of the transport channel 308. To fluidly couple the pump 310 and the fluid flow passageway 308*a* of the transport channel 308, the example fluidic channel 300 includes a junction 318 (e.g., connection or intersection). In illustrated example, the pump 310 and the transport channel 308 of the illustrated example form a T-shaped profile or connection when the pump 310 is coupled to the transport channel 308 at the junction 318. In other words, the pump 310 of the illustrated example is oriented at least substantially perpendicular (e.g., an orientation between 88 degrees and 92 degrees, an orientation of 90 degrees, etc.) relative the transport channel 308 to define a T-shaped connected auxiliary cavity. For example, a longitudinal axis 320 of the pump 310 is non-parallel or substantially perpendicular relative to a longitudinal axis 322 of the transport channel 308. However, in some examples, to increase an efficiency of the pump 310, the pump 310 may be coupled to the transport channel 308 at an angle (e.g., a Y-connection). For example, when the pump 310 is coupled at an angle relative to the transport channel 308, the longitudinal axis 320 of the pump 310 may be positioned at a non-parallel and a non-perpendicular orientation relative to the longitudinal axis 322 (e.g., a horizontal axis) of the transport channel 308.

To induce fluid flow in the transport channel 308, the pump 310 of the illustrated example includes an auxiliary fluid channel 324 (e.g., a pump cavity or pump channel) and a fluid actuator 326 (e.g., a resistor). The auxiliary fluid channel 324 of the illustrated example defines a cavity 328 between a first end 330 of the auxiliary fluid channel 324 and a second end 332 of the auxiliary fluid channel 324 opposite the first end 330. In particular, the first end 330 of the auxiliary fluid channel 324 of the illustrated example is in fluid communication with the transport channel 308 via the junction 318. The second end 332 of the auxiliary fluid channel 324 of the illustrated example is spaced from the fluid flow passageway 308*a* of the transport channel 308. In particular, the second end 332 projects away from the transport channel 308. More specifically, the second end 332 of the illustrated example projects away from the transport channel 308 by a distance defined by an overall length 334 (e.g., P in FIG. 3) of the auxiliary fluid channel 324. The second end 332 of the auxiliary fluid channel 310 of the illustrated example is capped or walled (e.g., provides a dead-end flow path) and prevents fluid flow therethrough. In some examples, the second end 332 contains a vent hole to vent the auxiliary fluid channel 324 (e.g., prevent trapping of gas bubbles within the auxiliary fluid channel 324). The overall length 334 of the auxiliary fluid channel 324 may be between approximately 200 micrometers and 400 micrometers. In addition, the auxiliary fluid channel 324 of the illustrated example has a rectangular cross-section defining a width and a height of the cavity 328 and/or the auxiliary fluid channel 324. For example, each of the height and width of the auxiliary fluid channel 324 may be between approximately 10 micrometers and approximately 30 micrometers. However, in other examples, the overall length 334 of the auxiliary fluid channel 324 may be any other length and/or the transport channel 308 may include another cross-sectional shape (e.g., a circular cross-section).

Additionally, in the illustrated example, the auxiliary fluid channel 324 has a dimensional envelope or profile substantially similar (e.g., equal) to a dimensional envelope or profile of the transport channel 308. In other words, the overall length 316, the height, the width and the cross-sectional profile of the transport channel 308 of the illustrated example are substantially similar (e.g., equal) to the respective overall length 334, height, width, and cross-sectional profile of the pump 310 and/or the auxiliary fluid channel 324. In some examples, the dimensional profile (e.g., a cross-sectional profile) of the transport channel 308 may be different than a dimensional profile (e.g., a cross-sectional profile) of the pump 310 and/or a portion of the auxiliary fluid channel 324. For example, a cross-sectional profile of the transport channel 308 may be rectangular or square and the cross-sectional profile of the pump 310 and/or the auxiliary fluid channel 324 may be circular, conical and/or any other cross-sectional shape.

When activated, the fluid actuator 326 creates a high pressure region 350 (e.g., a vapor bubble that may include a heat zone) within the auxiliary fluid channel 324. In some examples, the fluid actuator 326 also produces a localized high temperature region that at least partially overlaps a portion of the high pressure region 350. To reduce, or even eliminate, a pressure and/or thermal impact to the fluid in the transport channel 308, the fluid actuator 326 is positioned within the cavity 328 of the auxiliary fluid channel 324 and outside of the fluid flow passageway 308*a* of the transport channel 308. The fluid actuator 326 of the pump 310 may be at any position within the cavity 328 of the auxiliary fluid channel 324 between the first end 330 of the auxiliary fluid channel 324 and the second end 332 of the auxiliary fluid channel 324. For example, the fluid actuator 326 may be positioned at a distance 336 (e.g., between approximately 50 micrometers and approximately 150 micrometers) relative to the first end 330 of the auxiliary fluid channel 324. In some examples, the fluid actuator 326 may be positioned at a distance 338 (e.g., P/2 in FIG. 3) from the first end 330 that centrally locates the fluid actuator 326 relative to the overall length 334 of the auxiliary fluid channel 324 (e.g., a position symmetric relative to the overall length 336 of the auxiliary fluid channel 324). In some examples, the fluid actuator 326 may have a cross-sectional profile that is at least substantially similar (e.g., equal) to a width and/or height of the cross-sectional profile of the auxiliary fluid channel 324. For example, a perimeter of a cross-section of the fluid actuator 326 may be at least substantially similar (e.g., equal) to a perimeter of a cross-section of the auxiliary fluid channel 324. In some examples, a cross-sectional profile of the fluid actuator 326 may be smaller than a cross-sectional profile of the auxiliary fluid channel 324. The fluid actuator 326 may be a pump actuator such a thermal inkjet pump, a piezoelectric inkjet pump, a piezoelectric element and/or any other mechanical displacement actuator.

Placement of the fluid actuator 326 relative to the first end 330 may affect pump efficiency or performance. For example, the pump 310 may induce a greater amount of pressure and/or fluid displacement in the fluid flow passageway 308*a* of the transport channel 308 when the fluid actuator 326 is positioned closer to the first end 330 and/or the junction 318 than when the fluid actuator 326 is positioned farther away from the first end 330 and/or the junction 318. As a result, positioning the fluid actuator 326 closer to the first end 330 of the auxiliary fluid channel 324 provides a greater pressure and/or greater fluid displacement in the fluid flow passageway 308*a* of the transport channel 308 and positioning the fluid actuator 326 further away from the first end 330 of the auxiliary fluid channel 324 provides lesser pressure and/or fluid displacement in the fluid flow passageway 308*a* of the transport channel 308. Thus, higher pump efficiency may be achieved when the fluid actuator 326 is positioned closer to the junction 318 than when the fluid actuator 326 is positioned farther away from the junction 318. However, a greater amount of high pressure and/or heat generated by the fluid actuator 326 may spill into the transport channel 308 when the fluid actuator 326 is positioned closer to the first end 330 than when the fluid actuator 326 is positioned farther away from the first end 330. In some instances, the fluid actuator 326 is spaced from the junction 318 (e.g., an intersection between the transport channel 308 and the auxiliary fluid channel 324) to reduce or prevent bubbles (e.g., vapor bubbles) that may be generated during activation of the fluid actuator 326 from spilling into the fluid flow passageway 308*a* of the transport channel 308. Thus, in some such instances, positioning the fluid actuator 326 in the auxiliary fluid channel 324 closer to the second end 332 than the first end 330 may help prevent or reduce instances of vapor or bubble spillage into the fluid flow passageway 308*a* of the transport channel 308. In this manner, the vapor generated during fluid actuator activation is contained within the auxiliary fluid channel 324 and does not flow into the fluid flow passageway 308*a* of the transport channel 308. Thus, although the pump 310 may be less efficient when the fluid actuator 326 is positioned further away from the junction 318, in some examples, the fluid actuator 326 may be positioned further away from the junction 318 to decrease or reduce pressure and/or thermal impact within the fluid flow passageway 308*a* of the transport channel 308. To increase pump efficiency when the fluid actuator is positioned closer to the second end 332 of the auxiliary fluid channel 324 than the first end 330, a size (e.g., a power output) of the fluid actuator 326 may be increased and/or an actuation frequency of the fluid actuator 326 may be increased.

To induce fluid flow within the transport channel 308 when the pump 310 is activated, the pump 310 of the illustrated example is positioned asymmetrically relative to the overall length 316 of the transport channel 308. In other words, the pump 310 and/or the first end 330 (e.g., an outlet) of the pump 310 is offset relative to a center 340 (e.g., L/2 in FIG. 3) of the overall length 316 (e.g., L in FIG. 3) of the transport channel 308. In the illustrated example, the pump 310 and/or the first end 330 of the auxiliary fluid channel 324 is positioned a distance 342 from the first end 312 of the transport channel 308. In other words, the pump 310 of the illustrated example is positioned closer to the first end 312 of the transport channel 308 than to the second end 314 of the transport channel 308. The asymmetric placement of the pump 310 and/or the first end 330 of the auxiliary fluid channel 324 relative to the center 340 of the transport channel 308 creates a short side 344 (e.g., a short arm) of the transport channel 308 and a long side 346 (e.g., a long arm) of the transport channel 308. In this manner, the asymmetric location of the pump 310 relative to the center 326 of the transport channel 308 creates inertial conditions that drive fluidic diodicity (i.e., net fluid flow) within the transport channel 308.

For example, the pump 310 of the illustrated example induces unidirectional fluid flow (e.g., fluid flow in only one direction) within the transport channel 308 from the first portion 302 toward the second portion 306 when the pump 310 is activated because the pump 310 is positioned closer to the first portion 302 of the fluidic network 304 than the second portion 306 of the fluidic network 304. For instance, placing the pump 310 at the center 340 of the overall length 316 of the transport channel 308 may not induce fluid flow and/or fluid displacement through the transport channel 308 toward the second portion 306 of the fluidic network 304 (e.g., a no flow condition). Thus, a pump 310 forming a T-connection when coupled to the transport channel 308 and positioned in fluidic symmetry with (e.g., at the center 326 of) the overall length 316 of the transport channel 308 may induce mixing within the transport channel 308, but the pump 310 may not induce fluid flow through the transport channel 308 from the first portion 302 to the second portion 306.

Additionally, asymmetric placement of the pump 310 relative to the center 340 of the transport channel 308 can affect overall pump efficiency. For example, positioning the pump 310 closer to the center 340 may cause pump efficiency to decrease resulting in a lower fluid flow displacement through the transport channel 308 per pump cycle. Positioning the pump 310 further from the center 340 and closer to either one of the first portion 302 or the second portion 306 of the fluidic network 304 may increase pump efficiency to provide a greater fluid flow displacement through the transport channel 308 per pump cycle. To induce fluid flow from the second portion 306 toward the first portion 302, the pump 310 of the illustrated example may be positioned asymmetrically relative to the center 340 of the transport channel 308 and closer to the second portion 306 such that a short side of the transport channel 308 is defined closer to the second portion 306 and a long side of the transport channel 308 is defined closer to the first portion 302.

Figure 4:
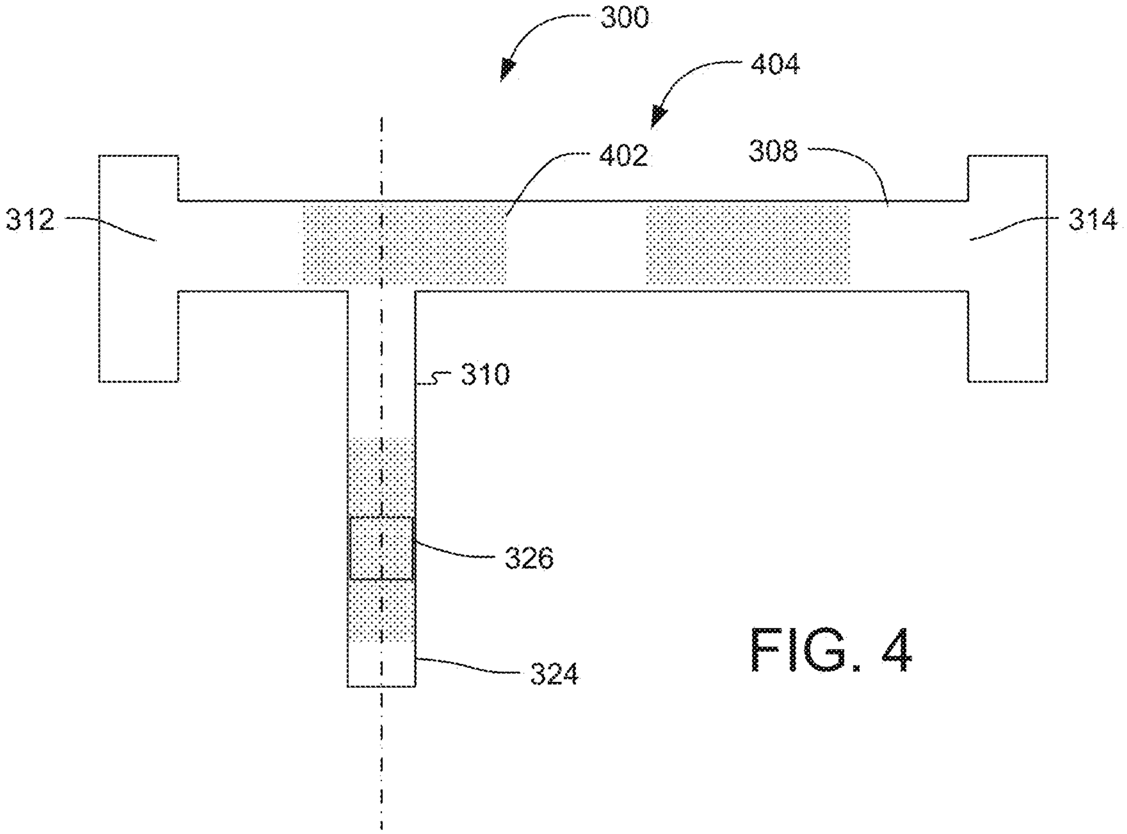
FIGS. 4-7 depict an example pump cycle of the example fluidic channel of FIG. 3.

FIGS. 4-7 illustrate an example fluid displacement through the example fluidic channel 300 of FIG. 3 during a complete pump cycle. FIG. 4 illustrates the example fluidic channel 300 having fluid 402 (e.g., a fluid having fragile components such as bio-chemical ingredients or biological cells) at an initial position 404 prior to activation of the pump 310. In operation, to induce fluid flow from the first end 312 of the transport channel 308 toward the second end 314 of the transport channel 308, the fluid actuator 326 is activated. For example, the fluid actuator 326 of the pump 310 may be activated or actuated via, for example, a controller (e.g., the controller 118 of FIG. 1). For example, the controller may cause a power source (e.g., the power source 128 of FIG. 1) to provide power to the fluid actuator 326. For example, the fluid actuator 326 may be a thermal resistor that receives current from the power supply to provide a pumping effect through the transport channel 308.

Figure 5:
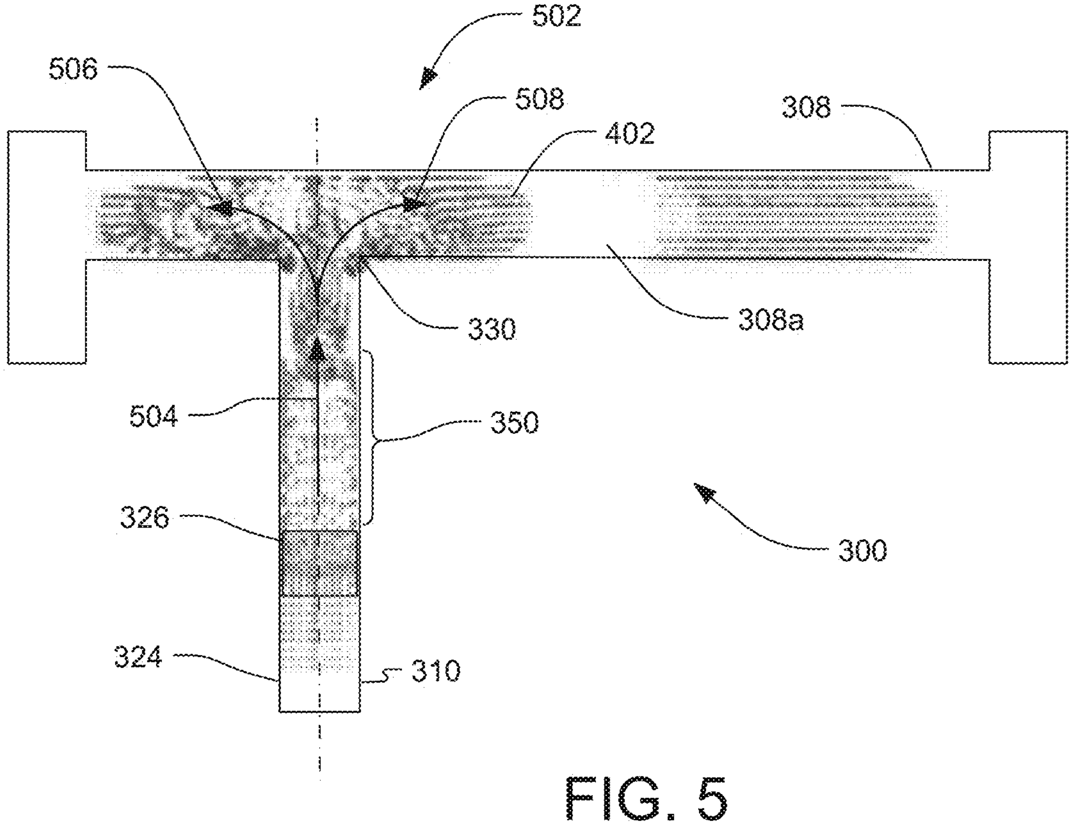

FIG. 5 depicts fluid displacement through the example fluidic channel 300 during an expansion phase 502 of a pump cycle of the pump 310. For example, the high pressure region 350 defines the expansion phase 502 (e.g., bubble expansion) of a pump cycle of the pump 310. The high pressure region 350 induces an outward fluid displacement (e.g., a wave) in the auxiliary fluid channel 324 in a direction 504 along the longitudinal axis 320 of the auxiliary fluid channel 324. Although the high pressure region 350 is generated within the auxiliary fluid channel 324, the outward fluid displacement created by the high pressure region 350 moves toward the first end 330 of the auxiliary fluid channel 324 and into the transport channel 308 via the fluid communication with the junction 318. In turn, the displaced fluid in the auxiliary fluid channel 324 caused by the high pressure region 350 induces bidirectional fluid flow or fluid displacement in the fluid flow passageway 308*a* of the transport channel 308. In particular, fluid in the fluid flow passageway 308*a* of the transport channel 308 is directed in a first direction 506 toward the first end 312 of the transport channel 308 and a second direction 508 toward the second end 314 of the transport channel 308. As shown in FIG. 5, due to the placement of the fluid actuator 326 relative to the first end 330 and/or the transport channel 308, the high pressure region 350 and/or heat generated by the fluid actuator 326 when activated does not project into the transport channel 308. In other words, the high pressure region 350 and/or heat produced by the fluid actuator 326 is maintained within the auxiliary fluid channel 324 and does not spill into the transport channel 308 when the fluid actuator 326 is activated because the fluid actuator 326 is not positioned within the transport channel 308. Therefore, fragile elements (e.g., cells) in the fluid 402 flowing through the fluid flow passageway 308*a* of the transport channel 408 are protected from high pressure and/or thermal impact. For instance, cell components in a fluid flowing through a vapor bubble may become damaged. However, in the illustrated example, the high pressure region 350 (e.g., including a vapor bubble or vapor-liquid interface) is maintained in the auxiliary fluid channel 324 and away from fluid flowing through the fluid flow passageway 308*a* of the transport channel 308.

Figure 6:
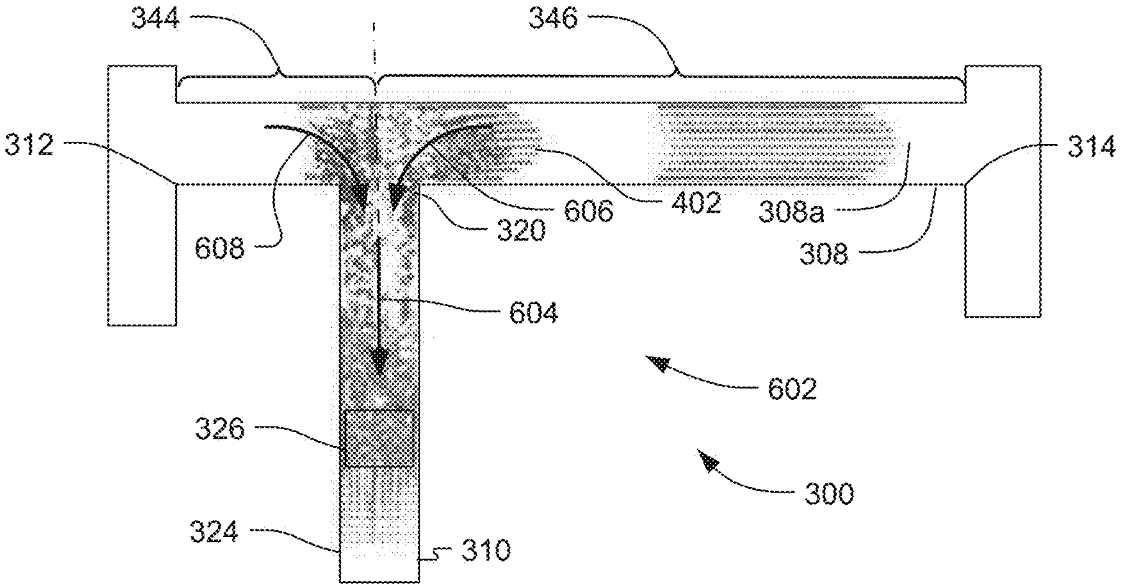

FIG. 6 depicts fluid displacement through the example fluidic channel 300 during a collapse phase 602 of a pump-cycle. As the fluid expands within the auxiliary fluid channel 324, the pressure quickly drops within the auxiliary fluid channel 324 (e.g., below atmospheric pressure), causing expansion of the fluid to slow, and eventually causing inward or reverse flow or fluid displacement within the auxiliary fluid channel 324 (e.g., bubble collapse). Such inward flow or fluid displacement within the auxiliary fluid channel 324 defines the collapse phase 602 of the pump cycle of the pump 310. More specifically, during the collapse phase of the pump cycle, fluid displacement within the auxiliary fluid channel 324 occurs in an opposite direction compared to the fluid displacement that occurs during the expansion phase 502. In other words, fluid displacement within the auxiliary fluid channel 324 during the collapse phase 602 induces an inward flow in a direction 604 away from the first end 320 of the auxiliary fluid channel 324. Such inward fluid displacement is sensed within the fluid flow passageway 308*a* of the transport channel 308 via the junction 318. As a result, the fluid 402 in the transport channel 308 also displaces inwardly and reverses direction, causing fluid in the short arm 342 of the transport channel 308 and fluid flow in the long arm 346 of the transport channel 308 to flow toward the junction 318 and away from the respective first and second ends 312 and 314 of the transport channel 308.

A net fluid flow through the transport channel 308 is provided as a result of the expansion-collapse cycle. For example, the inward flow or fluid displacement 606 and 608 in the transport channel 308 caused during the collapse phase 602 of the pump cycle collides at a point that in general is not the same as the starting point of the outward flow or fluid displacement (FIG. 5) in the fluid in the transport channel 308 during the expansion phase 502 of the pump cycle. In particular, the fluid 402 in the long arm 346 of the transport channel 308 has larger mechanical inertia at an end of the expansion phase 502 (FIG. 5) of the pump cycle. Therefore, the fluid 402 in the long arm 346 of the transport channel 308 reverses direction more slowly than the fluid 402 in the short arm 344 of the transport channel 308. As a result, the fluid 402 in the short arm 344 of the transport channel 308 has more time to gain mechanical momentum during the collapse phase 602 of the pump cycle. Thus, at the end of the collapse phase 602, the fluid 402 in the short arm 344 of the transport channel 308 has a larger mechanical momentum than the fluid in the long arm 346 of the transport channel 308, resulting in a net fluid flow or fluid displacement in a direction from the short side 344 toward the long side 346 of the transport channel 308. Since the net flow is a consequence of non-equal inertial properties of two fluidic elements (i.e., displacement of the fluid 402 in the short side 344 and the long side 346 of the transport channel 308 caused by the expansion-collapse cycle), the pump 310 of the illustrated example functions as an inertial pump.

Figure 7:
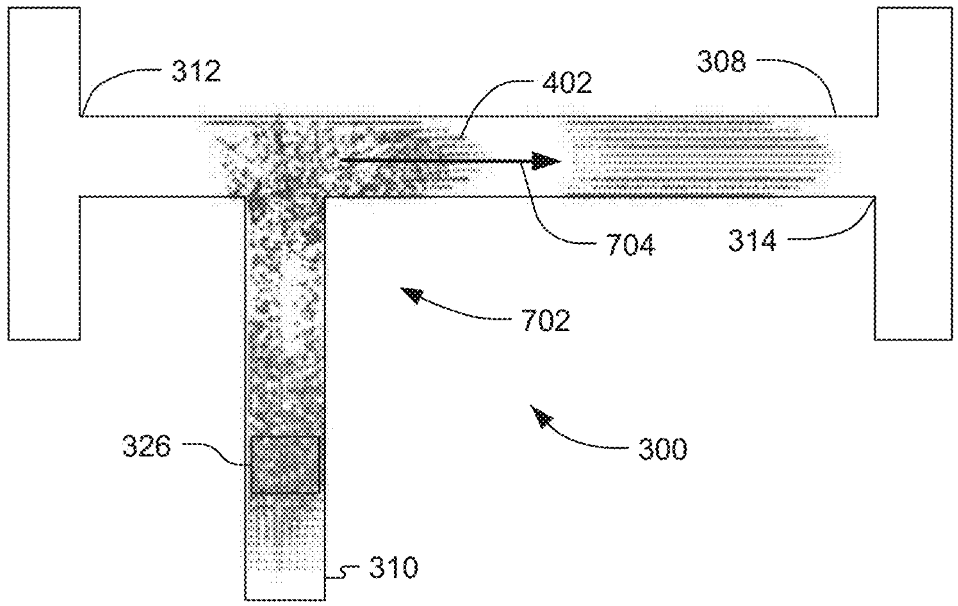

FIG. 7 depicts the fluid displacement through the example fluidic channel 300 during a post-collapse phase 702 of the pump cycle. In some instances, momenta of the fluid 402 from the short side 344 and the long side 346 colliding in the transport channel 308 during the collapse phase 602 may be different. As a result, the fluid 402 may continue to flow or be displaced in the transport channel 308 after the collapse phase 602 of the expansion-collapse cycle. For example, the fluid 402 may continue to flow or be displaced in a direction 704 from the first end 312 to the second end 314 until a total momentum of the fluid 402 in the transport channel 308 is dissipated via, for example, viscous dissipation (e.g., friction from walls of the transport channel 308). This phase defines the post-collapse phase 702 of the pump cycle. Thus, a total net flow or fluid displacement within the transport channel 308 for a given pump cycle of the pump 310 may be a total fluid displacement that occurs during the expansion phase 502, the collapse phase 602, and the post-collapse phase 702. In some instances, for example, fluid flow or fluid displacement within the transport channel 308 may terminate or stop at the end of the post-collapse phase 702, requiring activation of the fluid actuator 326 through another pump cycle to continue inducing fluid flow or a net fluid displacement through the transport channel 308. In some examples, depending on fluid properties and other factors such as dimensional envelope of the transport channel 308, the auxiliary fluid channel 324, and the size of the fluid actuator 326, each pump cycle may result in a net fluid displacement of approximately 4 picoliters through the transport channel 308.

FIGS. 8-16 illustrate example fluidic channels 800-1600 constructed in accordance with the teachings of this disclosure. The fluidic channels 800-1600 of the illustrated examples of FIGS. 8-16 may implement a microfluidic device such as, for example, the microfluidic device 102 of FIG. 1 and/or the microfluidic device 200 of FIG. 2. For example, the fluidic channels 800-1600 of the illustrated examples shown in FIGS. 8-16 may be used to implement the example fluidic network 102 of FIG. 1 and/or the fluidic channels 204-208 of FIG. 2. In some examples, the fluidic channel 302 of FIG. 3 may be include any of the features of the example fluidic channels 800-1600 of FIGS. 8-16. Those components of the example fluidic channels 800-1600 that are substantially similar or identical to the components of the example fluidic channel 300 described above in connection with FIG. 3 and that have functions substantially similar or identical to the functions of those components will not be described in detail again below. Instead, the interested reader is referred to the above corresponding descriptions. To facilitate this process, similar reference numbers will be used for like structures. The example fluidic channels 800-1600 are not limited to the examples disclosed herein. In some examples, a feature or structure of the example fluidic channels 800-1600 of FIGS. 8-16 may be combine with the other fluidic channels 800-1600 of FIGS. 8-16, the fluidic channels 204-208 of FIG. 2 and/or the fluidic channel 302 of FIG. 3.

Figure 8:
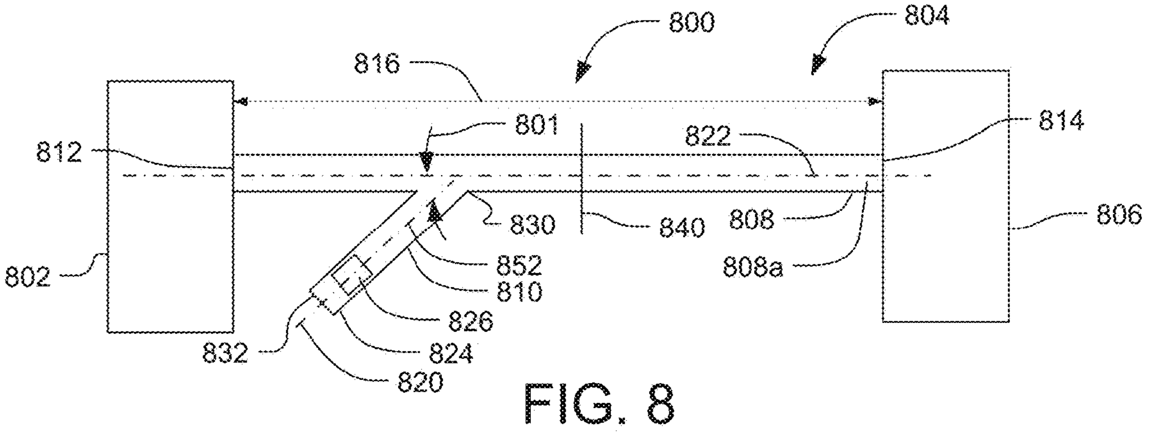
FIG. 8 depicts another example fluidic channel disclosed herein.

Referring to the example of FIG. 8, the fluidic channel 800 of the illustrated example includes a transport channel 808 (e.g., a substantially straight fluid flow passageway 808*a*) and a pump 810. In particular, the transport channel 808 of the illustrated example includes a first end 812 (e.g., an inlet) in fluid communication with a first network channel 802 and a second end 814 (e.g., outlet) in fluid communication with a second network channel 806. Additionally, the pump 810 of the illustrated example is positioned or orientated at an angle 801 relative to the transport channel 808 (e.g., a Y-connection). For example, the pump 810 and/or an auxiliary fluid channel 824 of the pump 810 is slanted, canted or otherwise bent relative to the transport channel 808 to form a Y-type connection between the pump 810 and the transport channel 808. For example, a longitudinal axis 820 of the pump 810 is positioned at a non-parallel and a non-perpendicular orientation relative to a longitudinal axis 822 (e.g., a horizontal axis) of the fluid flow passageway 808*a* of the transport channel 808. In this manner, a first end 830 of the auxiliary fluid channel 824 is in fluid communication with the transport channel 808 and a second end 832 of the auxiliary fluid channel 824 projects away from the transport channel 808. In the illustrated example, the second end 832 of the auxiliary fluid channel 824 is further away from a center 840 of the transport channel 808 than the first end 830 of the auxiliary fluid channel 824 when the pump 810 is coupled to the transport channel 808. However, in some examples, the second end 832 of the auxiliary fluid channel 824 may be closer to the center 840 of the transport channel 808 than the first end 830 of the auxiliary fluid channel 824. In the illustrated example, the angle 801 between the longitudinal axis 852 of the auxiliary fluid channel 824 and the longitudinal axis 822 of the transport channel 808 is approximately 45 degrees. However, in other examples, the angle 801 may be between approximately 10 degrees and approximately 170 degrees. In some examples, providing the pump 810 at an angle relative to the transport channel 808 as shown in FIG. 8 increases an efficiency of the pump 810 compared to the pump 810 being positioned substantially perpendicular to the transport channel 808 (e.g., a T-connection, a 90 degree connection, etc.) as shown, for example, in FIG. 3. In other words, the pump 810 may generate a greater amount of fluid flow or fluid displacement through the transport channel 808 than a pump positioned substantially perpendicular (e.g., approximately 90 degrees) relative to the transport channel 808. For example, positioning the pump 810 at an angle relative to the transport channel 808 increases a momentum of fluid within the auxiliary fluid channel 824 and/or decreases an amount of frictional forces (e.g., external or internal friction, wall friction, etc.) imparted to the fluid in the auxiliary fluid channel 824.

Figure 9:
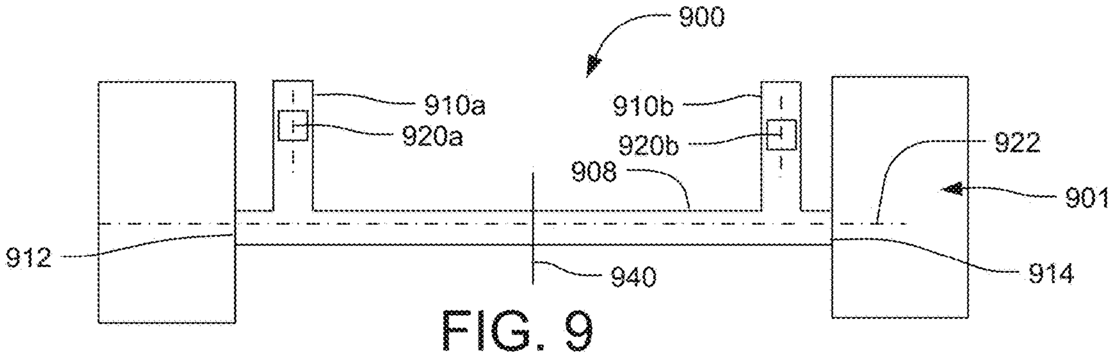
FIG. 9 depicts another example fluidic channel disclosed herein.

Referring to the example of FIG. 9, the example fluidic channel 900 includes a transport channel 908 (e.g., a substantially straight fluid flow passageway 908*a*) a first pump 910*a*, and a second pump 910*b*. More specifically, both the first pump 910*a* and the second pump 910*b* are positioned asymmetrically relative to a center 940 of the transport channel 908. In particular, the first pump 910*a* of the illustrated example is positioned between the a first end 912 of the transport channel 908 and the center 940 of the transport channel 908 and the second pump 910*b* is positioned between a second end 914 of the transport channel 908 and the center 940 (e.g., on a side of the center 940 that is opposite the side of the first pump 910*a*). In addition, the first pump 910*a* and the second pump 910*b* are positioned on a same side 901 of the longitudinal axis 922 of the transport channel 908 (e.g., an upper side of the transport channel 908 in the orientation of FIG. 9). In operation, the first pump 910*a* of the illustrated example induces fluid flow in the transport channel 908 in a direction from the first end 912 of the transport channel 908 to the second end 914 of the transport channel 908. The second pump 910*b* of the illustrated example induces fluid flow in the transport channel 908 from the second end 914 of the transport channel 908 to the first end 912 of the transport channel 908 (e.g., a direction opposite the direction of fluid flow provided by the first pump 910*a*). A controller (e.g., the controller 118 of FIG. 1) may alternate activation of the first pump 910*a* and/or the second pump 910*b* to alter the direction of fluid flow in the transport channel 908 between the first end 912 and the second end 914. The first pump 910*a* and the second pump 910*b* of the illustrated example are substantially perpendicular relative to the transport channel 908. In other examples, the first pump 910*a* and/or the second pump 910*b* may be positioned at an angle (e.g., at a non-parallel and non-perpendicular angle, between 10 degrees and 80 degrees, etc.) relative to the transport channel 908.

Figure 10:
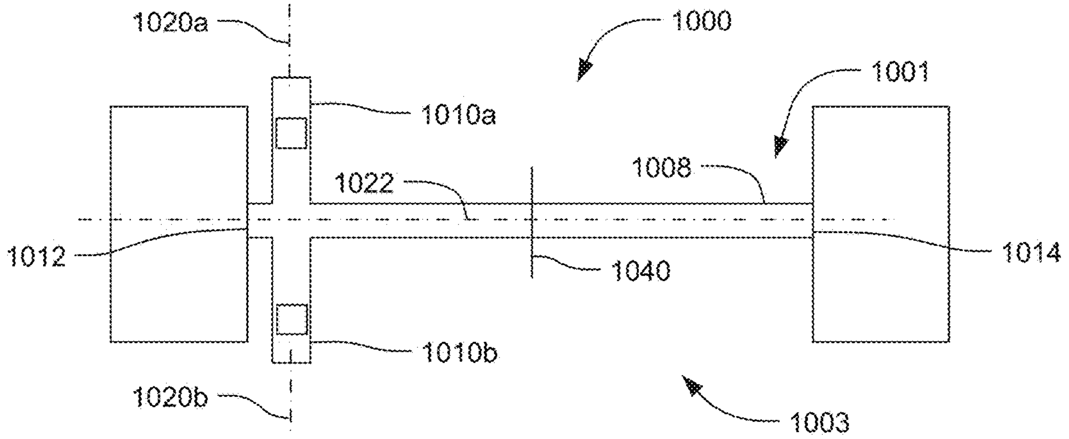
FIG. 10 depicts another example fluidic channel disclosed herein.

Referring to the example of FIG. 10, the example fluidic channel 1000 includes a transport channel 1008 (e.g., a substantially straight fluid flow passageway 1008*a*) a first pump 1010*a*, and a second pump 1010*b* (e.g., a dual pump system). In the illustrated example, both the first pump 1010*a* and the second pump 1010*b* are positioned asymmetrically relative to a center 1040 of the transport channel 1008 and positioned between a first end 1012 of the transport channel 1008 and the center 1040 (e.g., on the same side of the center 1040). Additionally, the first pump 1010*a* of the illustrated example is positioned on a first side 1001 of a longitudinal axis 1022 of the transport channel 1008 and the second pump 1010*b* of the illustrated example is positioned on a second side 1003 of the longitudinal axis 1022 of the transport channel 1008. In other words, respective second ends 1032 of the first pump 1010*a* and the second pump 1010*b* project from the transport channel 1008 in opposite directions. In addition, a longitudinal axis 1020*a* of the first pump 1010*a* of the illustrated example is substantially aligned (e.g., coaxially aligned and/or parallel) relative to a longitudinal axis 1020*b* of the second pump 1010*b*. In other words, the first pump 1010*a* and the second pump 1010*b* share the same centerline (e.g., vertical centerline in the orientation of FIG. 10). In addition, the first pump 1010*a* and the second pump 1010*b* of the illustrated example are substantially perpendicular (e.g., between approximately 88 degrees and 92 degrees) relative to the transport channel 1008 such that each of the first pump 1010*a* and the second pump 1010*b* each forms a T-connection with the transport channel 1008. In other examples, the first pump 1010*a* and/or the second pump 1010*b* may be positioned at an angle (e.g., at a non-parallel and non-perpendicular angle) relative to the transport channel 1008. In operation, the first pump 1010*a* and the second pump 1010*b* may operate simultaneously and/or alternatively to induce fluid flow or displacement through the transport channel 1008. In some examples, the second pump 1010*b* is a back-up pump and operates when the first pump 1010*a* is in a non-working or fail condition (e.g., is non-operating). A controller (e.g., the controller 118 of FIG. 1) may activate the first pump 1010*a* and the second pump 1010*b* (e.g., simultaneously or alternatively) to induce fluid flow in the transport channel 1008 from the first end 1012 to the second end 1014.

Figure 11:
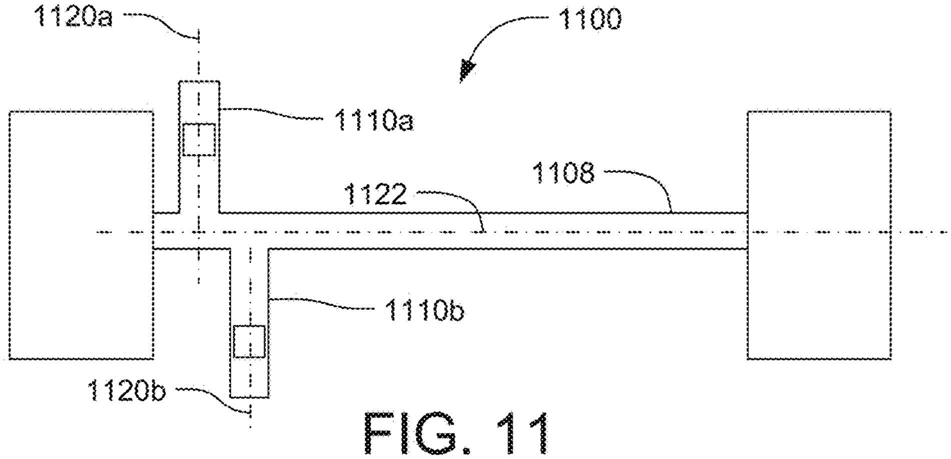
FIG. 11 depicts another example fluidic channel disclosed herein.

FIG. 11 illustrates another example fluidic channel 1100 disclosed herein. The fluidic channel 1100 of FIG. 11 is similar to the fluidic channel 1000 of FIG. 10. However, a first pump 1110*a* of the example fluidic channel 1100 is offset relative to a second pump 1110*b* of the example fluidic channel 1100. More specifically, a longitudinal axis 1120*a* of an example first pump 1110*a* is offset (e.g., parallel but not in coaxial alignment) relative to a longitudinal axis 1120*b* of an example second pump 1110*b*. In other words, the first pump 1110*a* and the second pump 1100*b* do not share the same centerline (e.g., the same vertical centerline in the orientation of FIG. 11).

Figure 12:
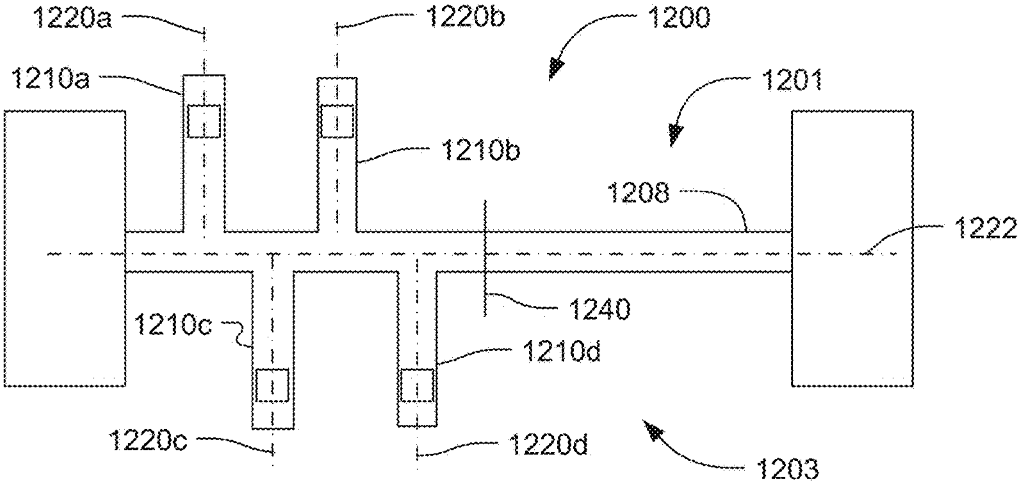
FIG. 12 depicts another example fluidic channel disclosed herein.

FIG. 12 illustrates another example fluidic channel 1200 disclosed herein. The example fluidic channel 1200 of FIG. 12 includes a first pump 1210*a*, a second pump 1210*b*, a third pump 1210*c* and a fourth pump 1210*d* coupled to the transport channel 1208. In the illustrated example, each of the first pump 1210*a*, the second pump 1210*b*, the third pump 1210*c* and the fourth pump 1210*d* is positioned between a first end 1212 of the transport channel 1208 and a center 1240 of the transport channel. Additionally, the first pump 1210*a* and the second pump 1210*b* of the illustrated example are positioned on a first side 1201 of the longitudinal axis 1222 of the transport channel 1208 and the third pump 1210*c* and the fourth pump 1210*d* are positioned on a second side 1203 of the longitudinal axis 1222 of the transport channel. Further, the first pump 1210*a*, the second pump 1210*b*, the third pump 1210*c* and the fourth pump 1210*d* include respective axes 1220*a*, 1220*b*, 1220*c*, and 1220*d*. Each of the axes 1220*a*, 1220*b*, 1220*c*, and 1220*d* of the illustrated example are offset relative to each other such that the axes 1220*a*, 1220*b*, 1220*c*, and 1220*d* are not coaxially aligned (e.g., the axes 1220*a*, 1220*b*, 1220*c*, and 1220*d* of the illustrated example do not share the same centerline). However, in some examples, the first axis 1220*a* of the first pump 1210*a* may be coaxially aligned with the third axis 1220*c* of the third pump 1210*c* and/or the second axis 1220*b* may be coaxially aligned with the fourth axis 1220*d* of the fourth pump 1210*d*.

Figure 13:
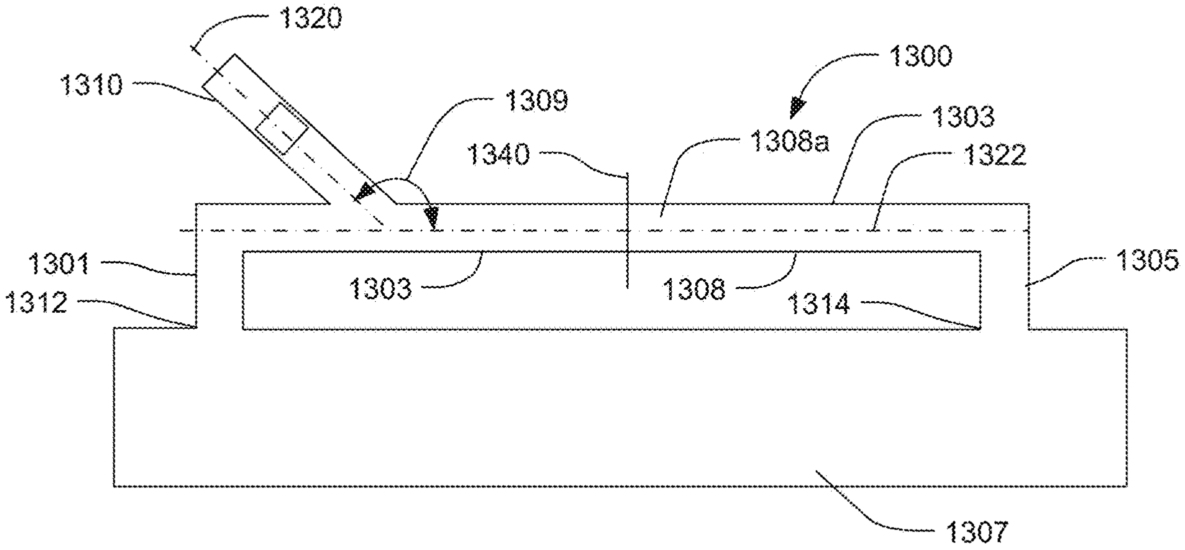
FIG. 13 depicts another example fluidic channel disclosed herein.

FIG. 13 illustrates another fluidic channel 1300 disclosed herein. The fluidic channel 1300 of the illustrated example includes a transport channel 1308 and a pump 1310 in fluid communication with the transport channel 1308. The pump 1310 of the illustrated example is positioned outside of a fluid flow passageway 1308*a* defined by the transport channel 1308. The transport channel 1308 of the illustrated example has a curved or bent profile or shape. For example, the transport channel 1308 of the illustrated example includes a first fluid path 1301, an intermediate fluid path 1303 and a second fluid path 1305. In the orientation of FIG. 13, the first fluid path 1301 and the second fluid path 1305 are orientated substantially perpendicular (e.g., vertically) relative to the intermediate flow path 1303 (e.g., which is oriented horizontally in the orientation of FIG. 13). The first fluid path 1301 is in fluid communication with a fluidic network 1307 (e.g., a reservoir) and the intermediate fluid path 1303. The second fluid path 1305 is in fluid communication with the intermediate fluid path 1303 and the fluidic network 1307. Thus, the example fluidic channel 1300 of the illustrated example provides a fluid recirculation system. The first fluid path 1301 defines a first end 1312 of the transport channel and the second fluid path 1305 defines a second end 1314 of the transport channel 1308. To induce fluid flow through the transport channel 1308, the pump 1310 is positioned asymmetrically relative to a center 1340 of the transport channel 1308 (e.g., the intermediate fluid path 1303). In addition, the pump 1310 is positioned at an angle 1309 relative to the transport channel 1308 and/or the intermediate flow path 1303. For example, a longitudinal axis 1320 of the pump 1310 is non-parallel and non-perpendicular relative to a longitudinal axis 1322 of the intermediate fluid path 1303 of the transport channel 1308. For example, the angle 1309 of the illustrated example may be between about 5 degrees and 175 degrees.

Figure 14:
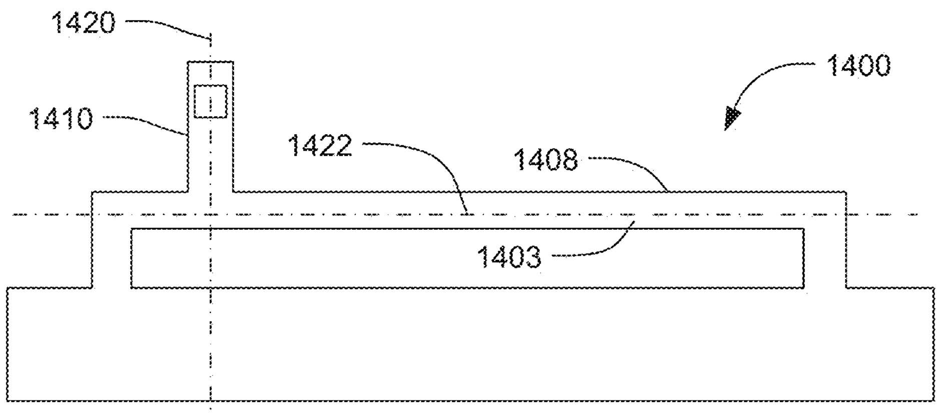
FIG. 14 depicts another example fluidic channel disclosed herein.

FIG. 14 illustrates another example fluidic network 1400 disclosed herein. The example fluidic network 1400 of FIG. 14 is substantially similar to the example fluidic channel 1300 of FIG. 13. More specifically, a pump 1410 is coupled in fluid communication with a transport channel 1408 and/or an intermediate flow path 1403 of the transport channel 1408. However, the pump 1410 of the illustrated example is positioned outside of a fluid flow passageway 1408*a* defined by the transport channel 1408. Unlike the example fluidic network 1300 of FIG. 13, the fluidic network 1400 of FIG. 14 includes the pump 1410 positioned substantially perpendicular (e.g., vertically) relative to the transport channel 1408 and/or the intermediate flow path 1403. In other words, a longitudinal axis 1420 of the pump 1410 is substantially perpendicular relative to a longitudinal axis 1422 of the transport channel 1408 and/or an intermediate flow path 1403.

Figure 15:
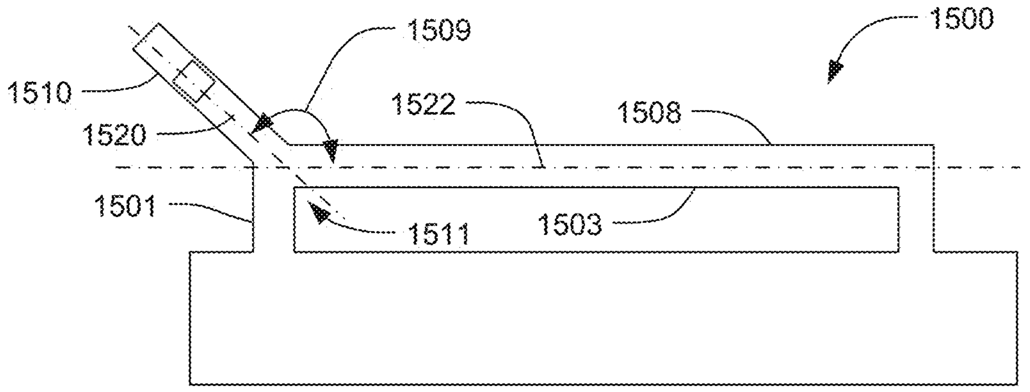
FIG. 15 depicts another example fluidic channel disclosed herein.

FIG. 15 illustrates another example fluidic channel 1500 disclosed herein. The example fluidic channel 1500 of FIG. 15 is substantially similar to the example fluidic channel 1300 of FIG. 13. However, a pump 1510 is positioned or coupled to the transport channel 1508 at an intersection 1511 (e.g., a corner formed) between a first fluid path 1501 of the transport channel 1508 and an intermediate fluid path 1503 of the transport channel 1508. In the illustrated example, the pump 1510 of the example fluidic channel 1500 is at angle relative to the transport channel 1508. In other words, the pump 1510 of the illustrated example is orientated at an angle relative to the first fluid path 1501 and the intermediate fluid path 1503. For example, a longitudinal axis 1520 of the pump 1510 is non-parallel and non-perpendicular relative to a longitudinal axis 1522 of the intermediate flow path 1503 of the transport channel 1508. For example, the angle 1509 of the illustrated example may be between about 5 degrees and 175 degrees.

Figure 16:
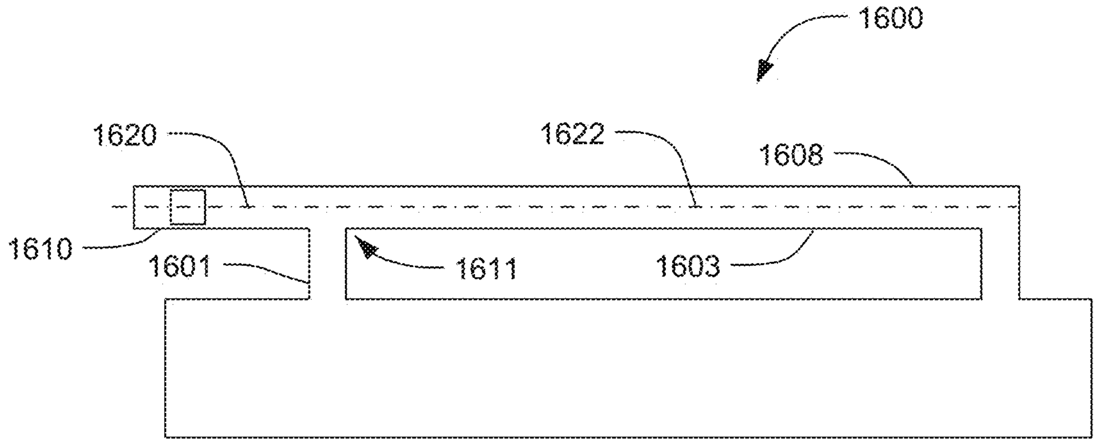
FIG. 16 depicts another example fluidic channel disclosed herein.

FIG. 16 illustrates another example fluidic network 1600 disclosed herein. The example fluidic network 1600 of FIG. 16 is substantially similar to the example fluidic channel 1500 of FIG. 15. A pump 1610 of the illustrated example is coupled to the transport channel 1608 at an intersection 1611 between a first flow path 1601 of the transport channel 1608 and an intermediate flow path 1603 of the transport channel 1608. Unlike the example fluidic channel 1500 of FIG. 15, the pump 1610 of the fluidic network 1600 of the illustrated example is substantially parallel (e.g., horizontal) relative to the transport channel 1608 and/or substantially perpendicular relative to a first flow portion 1601 of the transport channel 1608. For example, a longitudinal axis 1620 of the pump 1610 is substantially parallel (e.g., horizontal) and/or coaxially aligned with a longitudinal axis 1622 of the intermediate flow path 1603 and/or the transport channel 1608.

Figure 17:
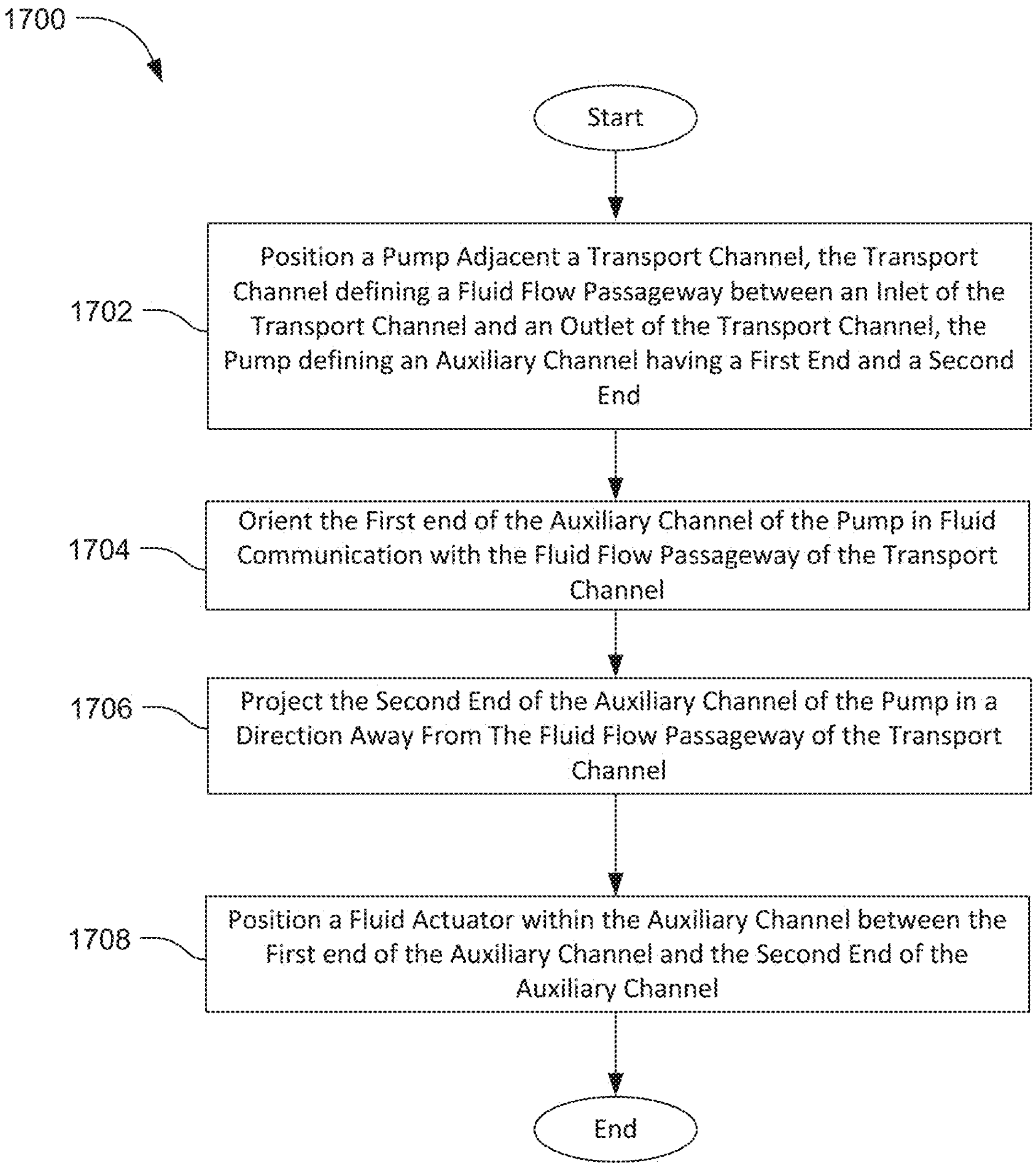
FIG. 17 is a flowchart illustrating an example method of forming an example fluidic channel disclosed herein.

FIG. 17 is a flowchart of an example method 1700 that may be used to form an example fluidic channel of a microfluidic network. For example, the example method 1700 may be used to form the example fluidic network 104 of FIG. 1, fluidic channels 204-208 of FIG. 2, the fluidic network 300 of FIG. 3, and/or the fluidic channels 800-1600 of FIGS. 8-16. While an example manner of forming an example fluidic channel has been illustrated in FIG. 17, one of the steps and/or processes illustrated in FIG. 17 may be combined, divided, re-arranged, omitted, eliminated and/or implemented in any other way. Further still, the example method of FIG. 17 may include processes and/or steps in addition to, or instead of, those illustrated in FIG. 17, and/or may include more than one of any or all of the illustrated processes and/or steps. Further, although the example method is described with reference to the flow chart illustrated in FIG. 17, many other methods of forming a fluidic channel (e.g., the fluidic network 104 of FIG. 1, the fluidic channels 204-208 of FIG. 2, the fluidic channel 302 of FIG. 3, and the fluidic channels 800-1600 of FIGS. 8-16) may alternatively be used. To facilitate discussion of the example method 1700, the example method 1700 will be described in connection with the example fluidic channel 302 of FIG. 3 and the fluid channel 802 of FIG. 8. However, the example method 1700 may be used to form the example fluidic network 104 of FIG. 1, the fluidic channels 204-208 of FIG. 2, and the example fluidic channels 900-1600 of FIGS. 9-16.

Referring the example method 1700, the method begins by positioning a pump 310, 810 adjacent a transport channel 308, 808, where the transport channel 308, 808 defines a fluid flow passageway **308*a*, 808*a* between a first end 312, 812 (e.g., an inlet) and a second end 314, 814 (e.g., an outlet) of the transport channel 308, 808, and the pump 310, 810 defines an auxiliary fluid channel 324, 824 having a first end 330, 830 and a second end 332, 832. (block 1702). For example, the pump 310, 810 and the transport channel 308, 808 may be formed in the substrate 210. In some examples, the first end 312, 812 (e.g., an inlet) of the transport channel 308 may be positioned in fluid communication with a first fluidic channel 302, 802 of a fluidic network. In some examples, the second end 314, 814 of the transport channel 308, 808 may be positioned in fluid communication with a second fluidic channel 306, 806 of a fluidic network. In some examples, the pump 310, 810 defines an auxiliary fluid channel 324, 824 having a first end 330, 830 and a second end 332, 832. In some examples, the pump 310, 810 is positioned between the first end 312, 812 and the second end 314, 814 of the transport channel 308, 808 and adjacent a center 340, 840 of the transport channel 308, 808**.

The first end 330, 830 an auxiliary fluid channel 324, 824 (e.g., an auxiliary fluid channel) of the pump 310, 810 is oriented in fluid communication with the fluid flow passageway **308*a*, 808*a* of the transport channel 308, 808 (block 1704). The second end of 332, 832 of the auxiliary fluid channel 324, 824 of the pump 310, 810 is to project in a direction away from the fluid flow passageway 308*a*, 808*a* of the transport channel 308, 808 (block 1706). A fluid actuator 326, 826 is positioned within the auxiliary fluid channel 324, 824 between the first end 330, 830 of the auxiliary fluid channel 324, 824 and a second end 332, 832 of the auxiliary fluid channel 324, 824 (block 1708). In this manner, the fluid actuator 326, 826 is positioned outside of the fluid flow passageway 308*a*, 808*a* of the transport channel 308, 808**.

As noted above, the example method 1700 may be implemented using thermal inkjet manufacturing techniques, integrated circuit microfabrication techniques, electroforming, laser ablation, anisotropic etching, sputtering, dry and wet etching, photolithography, casting, molding, stamping, machining, spin coating, laminating, 3-D printing, and/or any combination thereof and/or any other microelectrical mechanical system (i.e., MEMS), chip or substrate manufacturing technique(s).

Figure 18:
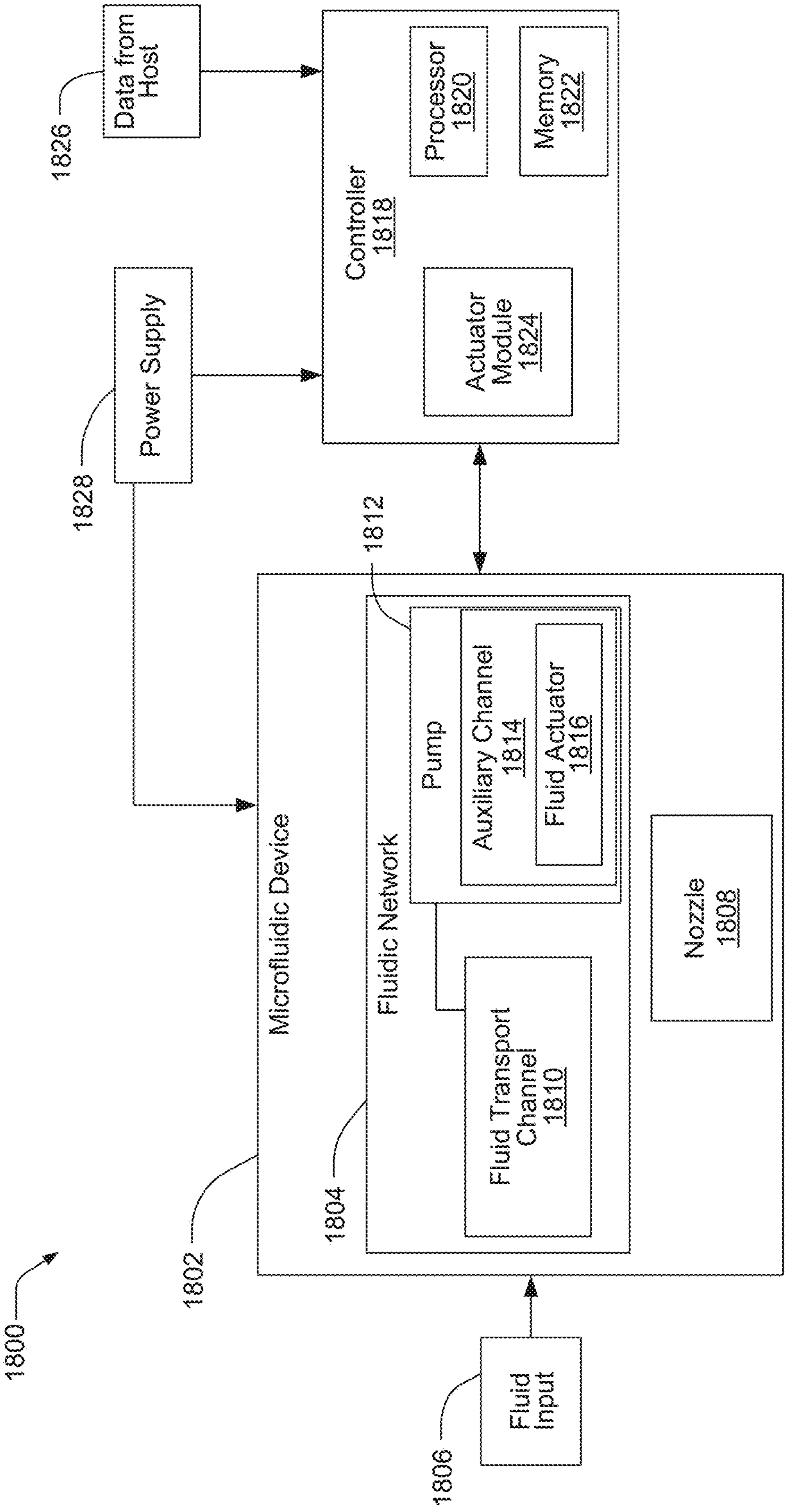
FIG. 18 is another example microfluidic system having an example microfluidic device constructed in accordance with the teachings described herein.

FIG. 18 illustrates another microfluidic system disclosed herein. For example, the microfluidic system 1800 may be used to implement a fluid ejection device such as, for example, an inkjet printer (e.g., a continuous inkjet printer) Those components of the example microfluidic system 1800 that are substantially similar or identical to the components of the example microfluidic system 100 described above in connection with FIG. 1 and that have functions substantially similar or identical to the functions of those components will not be described in detail again below. Instead, the interested reader is referred to the above corresponding descriptions. To facilitate this process, similar reference numbers will be used for like structures. For example, the microfluidic system 1800 of FIG. 18 includes a controller 1818, a processor 1820, memory 1822, an actuator module 1824, data 1826 and a power supply 1828 that are substantially similar to the example controller 118, the processor 120, memory 122, the actuator module 124, the data 126 and the power supply 128 of the example microfluidic system 100 of FIG. 1

The microfluidic system 1800 of the illustrated example includes a microfluidic device 1802 having a fluidic network 1804 to provide fluid flow (e.g., ink) from a fluid input 106 to a nozzle 1808. The fluidic network 1804 of the illustrated example includes a fluid transport channel 1810 and a pump 1812. The pump 1812 includes an auxiliary fluid channel 1814 and a fluid actuator 1816 positioned in the auxiliary fluid channel 1814. In some examples, the pump 1812 of the fluidic network 1804 enables a fluid in the fluid input 1806 to flow to the nozzle 1808 through the fluid transport channel 1810. The fluidic network 1804 of the example microfluidic device 1802 may be implemented by the example fluidic channels 204-208 of FIG. 2, the fluidic channel 302 of FIG. 3, the fluidic channels 800-1600 of FIGS. 8-16, and/or any combination thereof. The example microfluidic device 1802 may apply a pressure to the nozzle 1808 in order to break a continuous fluid jet (e.g., of ink) into droplets of equal size and spacing when the fluid is dispersed through the nozzle 1808. In some examples, unused drops are collected for recirculation and provided back to the fluid input 1806. For example, the example fluidic channels 1300-1600 of FIGS. 13-16 may be employed to recirculate unused drops to the fluid input 1806.

Figure 19:
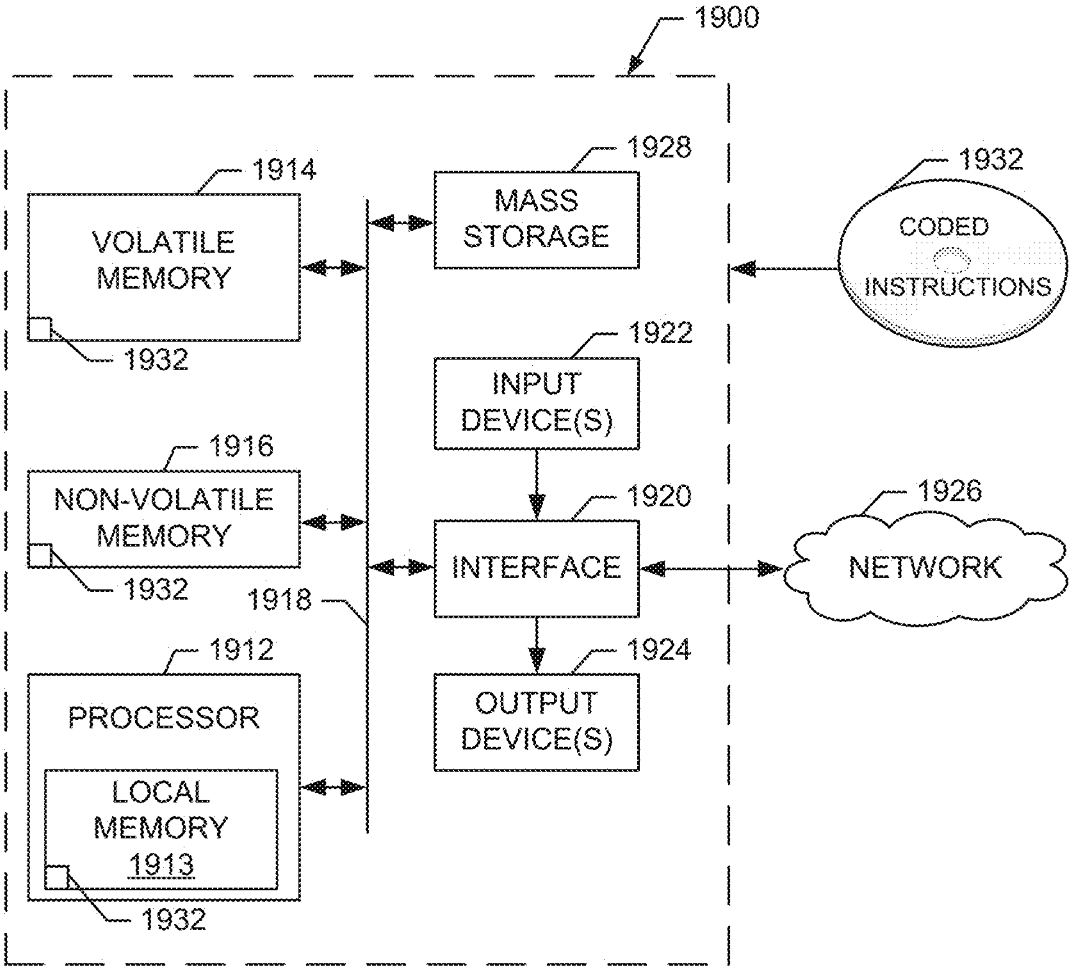
FIG. 19 is a block diagram of an example machine that may be used to implement the example methods and apparatus described herein.

FIG. 19 is a block diagram of an example processor platform 1900 capable of executing instructions to implement the controllers 118 and 1818 of FIGS. 1 and 18, respectively. The processor platform 1900 can be, for example, a server, a personal computer, a mobile device (e.g., a cell phone, a smart phone, a tablet such as an iPad™), a personal digital assistant (PDA), an Internet appliance, or any other type of computing device.

The processor platform 1900 of the illustrated example includes a processor 1912. The processor 1912 of the illustrated example is hardware. For example, the processor 1912 can be implemented by one or more integrated circuits, logic circuits, microprocessors or controllers from any desired family or manufacturer.

The processor 1912 of the illustrated example includes a local memory 1913 (e.g., a cache). The processor 1912 of the illustrated example is in communication with a main memory including a volatile memory 1914 and a non-volatile memory 1916 via a bus 1918. The volatile memory 1914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1916 may be implemented by flash memory and/or any other desired type of memory device. Access to the main memory 1914, 1916 is controlled by a memory controller.

The processor platform 1900 of the illustrated example also includes an interface circuit 1920. The interface circuit 1920 may be implemented by any type of interface standard, such as an Ethernet interface, a universal serial bus (USB), and/or a PCI express interface.

In the illustrated example, at least one input device 1922 is connected to the interface circuit 1920. The input device(s) 1922 permit(s) a user to enter data and commands into the processor 1912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1924 are also connected to the interface circuit 1920 of the illustrated example. The output devices 1924 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1920 of the illustrated example, thus, includes a graphics driver card, a graphics driver chip or a graphics driver processor.

The interface circuit 1920 of the illustrated example also includes a communication device such as a transmitter, a receiver, a transceiver, a modem and/or network interface card to facilitate exchange of data with external machines (e.g., computing devices of any kind) via a network 1926 (e.g., an Ethernet connection, a digital subscriber line (DSL), a telephone line, coaxial cable, a cellular telephone system, etc.).

The processor platform 1900 of the illustrated example also includes one or more mass storage devices 1928 for storing software and/or data. Examples of such mass storage devices 1928 include floppy disk drives, hard drive disks, compact disk drives, Blu-ray disk drives, RAID systems, and digital versatile disk (DVD) drives.

The coded instructions 1932 of FIG. 19 may be stored in the mass storage device 1928, in the volatile memory 1914, in the non-volatile memory 1916, and/or on a removable tangible computer readable storage medium such as a CD or DVD.

From the foregoing, it will be appreciated that the above disclosed methods, apparatus and articles of manufacture increase performance of a microfluidic systems. In particular, the example microfluidic devices and/or fluidic channels disclosed herein position a pump or fluid actuator outside of fluid flow passageway through which fluid (e.g., fragile elements of fluid) flows between an inlet of the passageway and an outlet of the passageway. The pump is positioned outside of the fluid flow passageway to eliminate or reduce exposure of fluids to high pressure and/or thermal impact that may otherwise occur when a fluid actuator is positioned inside the fluid flow passageway through which the fluid flows. On the contrary, the example fluidic channels disclosed herein generate a high pressure region and/or thermal region in an auxiliary fluid channel of the pump and not in the fluid flow passageway. Although in some instances positioning the fluid actuator in an auxiliary fluid channel (e.g., a cavity) outside of a fluid flow passageway of a transport channel may reduce pumping efficiency, the reduced pumping efficiency may be increased by increasing a size of the fluid actuator (e.g., a power size of the resistor) and/or a frequency of actuation of the fluid actuator. In some examples, pump efficiency may be increased by orientating the pump at an angle relative to the transport channel. The example methods and apparatus described above were developed in an effort to eliminate or reduce a high pressure and/or thermal impact to fluid flowing through a main fluid flow passageway of a microfluidic network. Thus, examples of the disclosure are described with reference to a microfluidic device for biological and/or bio-chemical applications. Additionally, the example fluidic channels disclosed herein may be implemented using integrated circuit thermal inject fabrication process(es) and/or technique(s), thereby providing a relatively small form factor and low cost apparatus.

At least some of the aforementioned examples include at least one feature and/or benefit including, but not limited to, the following:

In some examples, an example microfluidic device includes a body having a microfluidic network. The microfluidic network includes a main fluid channel to transport a fluid from a first cavity of the microfluidic network to a second cavity of the microfluidic network. An auxiliary fluid channel is in fluid communication with the main fluid channel. The auxiliary fluid channel has a first end and a second end. The first end is in fluid communication with the main fluid channel and the second end is spaced from the main fluid channel. A fluid actuator is positioned in the auxiliary fluid channel to induce fluid flow in the main fluid channel.

In some examples, an example microfluidic device includes a transport channel defining a fluid flow passageway between an inlet and an outlet. A pump is in fluid communication with the transport channel. The pump includes an auxiliary fluid channel having a first end and a second end. The first end is in fluid communication with the transport channel and the second end projects in a direction away from the fluid flow passageway of the transport channel. A fluid actuator is positioned within the auxiliary fluid channel of the pump.

In some examples, an example method for forming a microfluidic device includes In some examples, an example method for forming a microfluidic device includes positioning a pump adjacent a transport channel, the transport channel defining a fluid flow passageway between an inlet of the transport channel and an outlet of the transport channel, and the pump defining an auxiliary fluid channel having a first end and a second end; orienting the first end of the pump in fluid communication with the fluid flow passageway of the transport channel; projecting the second end of the auxiliary fluid channel of the pump in a direction away from the fluid flow passageway of the transport channel; and positioning a fluid actuator within the auxiliary fluid channel between the first end of the auxiliary fluid channel and the second end of the auxiliary fluid channel.

As noted at the beginning of this Description, the examples shown in the figures and described above illustrate but do not limit the disclosure. Other forms, details, and examples may be made and implemented. Therefore, the foregoing description should not be construed to limit the scope of the disclosure, which is defined in the following claims.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A microfluidic device comprising:

a body having a microfluidic network, the microfluidic network including:

a main liquid channel to transport a liquid from a first cavity of the microfluidic network to a second cavity of the microfluidic network, wherein the main liquid channel does not contain a fluid actuator;

an auxiliary liquid channel in fluid communication with the main liquid channel, the auxiliary liquid channel having a first end and a second end, the first end in fluid communication with the main liquid channel and the second end being spaced from the main liquid channel and the second end being a blind ending that is a capped end without any structure comprising an outlet; and a fluid actuator positioned in the auxiliary liquid channel to induce liquid flow in the main liquid channel, wherein the auxiliary liquid channel is positioned at an angle relative to the main liquid channel such that a longitudinal axis of the auxiliary liquid channel is non-parallel and non-perpendicular relative to a longitudinal axis of a main flow passageway defined by the main liquid channel.

2. The device as defined in claim 1, wherein the fluid actuator is positioned closer to the second end of the auxiliary liquid channel than to the first end of the auxiliary liquid channel.

3. The device as defined in claim 1, wherein the auxiliary liquid channel contains the only fluid actuator inducing liquid to flow through the main liquid channel and is positioned asymmetrically relative to an overall length of the main liquid channel and is configured to induce a unidirectional fluid flow in the main liquid channel.

4. The device as defined in claim 1, wherein the main liquid channel comprises a device to analyze biological fluid.

5. The device of claim 1, comprising a plurality of auxiliary liquid channels in fluid communication with the main liquid channel.

6. The device of claim 5, wherein channels of plurality of auxiliary liquid channels are located on a shared side of the main liquid channel.

7. The device of claim 5 wherein two auxiliary liquid channels are located, respectively, at different ends of the main liquid channel and are located symmetrically with respect to a center of the main liquid channel.

8. The device of claim 1, wherein the auxiliary liquid channel is positioned at a substantially 45 degree angle relative to the main liquid channel.

9. The device of claim 1, wherein the first cavity and the second cavity each extend above and below the main liquid channel.

10. The device of claim 1, wherein the first and second cavities each have a volume capacity greater than a volume capacity of the main liquid channel.

11. The device of claim 1, wherein the fluid actuator is positioned between approximately 50 and 150 micrometers from the first end of the auxiliary liquid channel.

12. The device of claim 1, wherein the second end of the auxiliary liquid channel is closer to a centerline of the main liquid channel than the first end of the auxiliary liquid channel.

13. A method for forming the microfluidic device of claim 1, the method comprising:

positioning the fluid actuator adjacent the main liquid channel, the fluid actuator located in the auxiliary liquid channel;

orienting a first end of the fluid actuator in fluid communication with the main flow passageway of the main liquid channel;

projecting a second end of the fluid actuator in a direction away from the main flow passageway of the main liquid channel; and wherein the fluid actuator is within the auxiliary liquid channel between the first end of the auxiliary liquid channel and the second end of the auxiliary liquid channel.

14. The method of claim 13, wherein the auxiliary liquid channel is at an angle of approximately between 10 degrees and 85 degrees relative to the main liquid channel.

15. The method of claim 13, wherein the auxiliary liquid channel is situated asymmetrically relative to an overall length of the main liquid channel.

16. A microfluidic device comprising:

a body having a microfluidic network, the microfluidic network including:

a main liquid channel to transport a liquid from a first cavity of the microfluidic network to a second cavity of the microfluidic network, wherein the main liquid channel does not contain a fluid actuator;

a plurality of auxiliary liquid channels in fluid communication with the main liquid channel, each auxiliary liquid channel having a first end and a second end, the first end in fluid communication with the main liquid channel and the second end being spaced from the main liquid channel and the second end being a blind ending that is a capped end having no outlet; and a fluid actuator positioned in at least one auxiliary liquid channel to induce liquid flow in the main liquid channel, wherein the at least one auxiliary liquid channel is positioned at an angle relative to the main liquid channel such that a longitudinal axis of the auxiliary liquid channel is non-parallel and non-perpendicular relative to a longitudinal axis of a main flow passageway defined by the main liquid channel;

wherein some of the auxiliary liquid channels are located on opposite sides of the main liquid channel.

17. A microfluidic device comprising:

a body having a microfluidic network, the microfluidic network including:

a main liquid channel to transport a liquid from a first cavity of the microfluidic network to a second cavity of the microfluidic network, wherein the main liquid channel does not contain a fluid actuator;

an auxiliary liquid channel in fluid communication with the main liquid channel, the auxiliary liquid channel having a first end and a second end, the first end in fluid communication with the main liquid channel and the second end being spaced from the main liquid channel and the second end being a blind ending that is a capped end having no outlet; and a fluid actuator positioned in the auxiliary liquid channel to induce liquid flow in the main liquid channel, wherein the auxiliary liquid channel is positioned at an angle relative to the main liquid channel such that a longitudinal axis of the auxiliary liquid channel is non-parallel and non-perpendicular relative to a longitudinal axis of a main flow passageway defined by the main liquid channel;

wherein the first and second cavities are different portions of a single reservoir and the main liquid channel fluidly connects to the two different portions of the single reservoir, the auxiliary liquid channel extending from a corner of the main liquid channel where the main liquid channel changes direction.

* * * * *